US012810044B2

(12) United States Patent
Wang et al.

(10) Patent No.: US 12,810,044 B2
(45) Date of Patent: Nov. 24, 2026

(54) AUTOMATIC DETERMINATION OF VENTILATION GRILLE OPENING SIZE FOR NUMERICAL SIMULATION SETUP AUTOMATION

(71) Applicant: Dassault Systemes Americas Corp., Waltham, MA (US)

(72) Inventors: Huhu Wang, Dearborn, MI (US); Satheesh Kandasamy, Waltham, MA (US)

(73) Assignee: Dassault Systemes Americas Corp., Waltham, MA (US)

(*) Notice: Subject to any disclaimer, the term of this patent is extended or adjusted under 35 U.S.C. 154(b) by 941 days.

(21) Appl. No.: 18/175,670

(22) Filed: Feb. 28, 2023

(65) Prior Publication Data

US 2024/0289520 A1 Aug. 29, 2024

(51) Int. Cl.

*G06F 30/23* (2020.01)
*G06F 30/17* (2020.01)
*G06T 7/62* (2017.01)
*G06V 10/44* (2022.01)

(52) U.S. Cl.

CPC .............. *G06F 30/23* (2020.01); *G06F 30/17* (2020.01); *G06T 7/62* (2017.01); *G06V 10/44* (2022.01)

(58) Field of Classification Search

CPC .......... G06F 30/23; G06F 30/28; G06F 30/20; G06T 7/62; G06T 17/20

See application file for complete search history.

(56) References Cited

U.S. PATENT DOCUMENTS

| | | | | |
|---|---|---|---|---|
| 2002/0111778 | A1 | 8/2002 | Barrow | |
| 2010/0070243 | A1 | 3/2010 | Yvon | |
| 2011/0025841 | A1* | 2/2011 | Cunningham | G06T 7/62 348/135 |
| 2018/0231371 | A1* | 8/2018 | Galin | G01B 11/00 |

(Continued)

FOREIGN PATENT DOCUMENTS

| | | |
|---|---|---|
| EP | 0967122 | 12/1999 |
| EP | 3809308 | 4/2021 |

OTHER PUBLICATIONS

European Search Report for Application EP24160114.5 dated Jul. 5, 2024.

(Continued)

*Primary Examiner* — Brian W Wathen

(74) *Attorney, Agent, or Firm* — Sheehan Phinney Bass & Green PA

(57) ABSTRACT

A computer-implemented method is disclosed that includes automatically determining a ventilation grille opening size estimation for numerical simulation setup automation based on an input in a computer-implemented environment. The computer-implemented method includes creating screenshots of a plurality of computer-rendered images of a three-dimensional grille geometry, with the three-dimensional grille geometry disposed at a different angle of rotation about a first axis, identifying which, if any, of the screenshots has an image of the three-dimensional grille geometry with a total opening value that is larger than every other one of the screenshot three-dimensional grille geometry images, and designating the identified image as a target image for further processing to determine the ventilation grille opening size estimation.

20 Claims, 9 Drawing Sheets

(56) References Cited

U.S. PATENT DOCUMENTS

| | | | | |
|---|---|---|---|---|
| 2020/0034497 | A1 | 1/2020 | Goswami | |
| 2021/0115802 | A1* | 4/2021 | Wang | F01D 5/16 |
| 2022/0383568 | A1* | 12/2022 | Mashiko | G06T 11/00 |
| 2022/0398781 | A1* | 12/2022 | Saban | A61B 3/024 |
| 2023/0154028 | A1* | 5/2023 | Claxton | G06V 10/764<br>382/190 |
| 2024/0013497 | A1* | 1/2024 | Sun | G06T 7/579 |

OTHER PUBLICATIONS

Kim, H. et al; "A numerical analysis for the cooling module related to automobile air-conditioning system"; Applied Thermal Engineering, vol. 28, No. 14-15, Oct. 1, 2008.

Bradski, G., 2000. The OpenCV Library. Dr. Dobb's Journal of Software Tools.

Canny, J., 1986. "A computational approach to edge detection", IEEE Transactions on pattern analysis and machine intelligence, (6), pp. 679-698.

Shamos, M., 1978. "Computational Geometry", Yale University. pp. 76-81.

Extended European Search Report for EP22208391.7 dated Apr. 12, 2023.

* cited by examiner

Small grille, VR11 (finest VR), 8 mesh elements across the grille

Large grille, VR11 (finest VR), 16 mesh elements across the grille, current best practice without the invention, waste of computational resources Large grille, VR10 (2nd finest VR), 8 mesh elements across the grille, with the invention, no need for VR11 (more savings)

AUTOMATIC DETERMINATION OF VENTILATION GRILLE OPENING SIZE FOR NUMERICAL SIMULATION SETUP AUTOMATION

FIELD OF THE INVENTION

This disclosure relates to determining ventilation grille opening sizes and, more specifically, relates to automatic determination of ventilation grille opening sizes for numerical simulation setup automation in a computer-implemented environment.

BACKGROUND

In a numeric simulation, to optimize computational resources, varied meshing sizes are often applied in different fluid regions. These regions are also known as variable resolution (VR) regions and have sizes defined by separate referencing geometries. Specifically, for a Lattice-Boltzmann Method (LBM) based simulation, VR regions have varied lattice refinement sizes among different levels.

SUMMARY OF THE INVENTION

In one aspect, a computer-implemented method is disclosed that includes automatically determining a ventilation grille opening size estimation for numerical simulation setup automation based on an input in a computer-implemented environment. The computer-implemented method includes creating screenshots of a plurality of computer-rendered images of a three-dimensional grille geometry, with the three-dimensional grille geometry disposed at a different angle of rotation about a first axis, identifying which, if any, of the screenshots has an image of the three-dimensional grille geometry with a total opening value that is larger than every other one of the screenshot three-dimensional grille geometry images, and designating the identified image as a target image for further processing to determine the ventilation grille opening size estimation.

In another aspect, a computer-implemented method is disclosed that includes automatically determining a ventilation grille opening size estimation for numerical simulation setup automation based on an input in a computer-implemented environment. The computer-implemented method includes importing a three-dimensional grille geometry, calculating an oriented bounding box based on the three-dimensional grille geometry, identifying an initial viewing vector for the imported three-dimensional grille geometry, creating a spatial calibration box to associate a pixel domain of a computer-rendered image of the three-dimensional grille geometry and a physical domain for including a real-world version of a grille based on the three-dimensional grille geometry, screenshotting a series of computer-rendered images of the three-dimensional grille geometry from a perspective defined by the initial viewing vector and with the three-dimensional grille geometry disposed at different orientations (each orientation showing the image of the three-dimensional grille geometry at a different angle of rotation about a first axis), identifying which, if any, of the screenshot three-dimensional grille geometry images has a total opening value that is larger than every other one of the screenshot three-dimensional grille geometry images, designating the image in the screenshot three-dimensional grille geometry image identified as having a total opening value that is larger than every other one of the screenshot three-dimensional grille geometry images as a target image, calculating a calibration factor for the target image, extracting edges of the target image; identifying contours in the target image based on the extracted edges; calculating areas within the identified contours, rejecting outlier contours based on the area calculations to produce a contour list containing only preserved contours, calculating a two-dimensional oriented bounding box for each contour represented in the contour list and returning a width value and a length value for each respective one of the two-dimensional oriented bounding boxes, identifying a minimum value, as between the width value and the length value, for each respective one of the two-dimensional oriented bounding boxes, and calculating a final opening size value to represent the ventilation grille opening size estimation based on the identified minimum values.

In yet another aspect, a computer system is configured to automatically determine a ventilation grille opening size estimation for numerical simulation setup automation based on an input in a computer-implemented environment. The computer system includes a computer processor and computer-based memory operatively coupled to the computer processor, wherein the computer-based memory stores computer-readable instructions that, when executed by the computer processor, cause the computer-based system to: create screenshots of a plurality of computer-rendered images of a three-dimensional grille geometry, with the three-dimensional grille geometry disposed at a different angle of rotation about a first axis, identify which, if any, of the screenshots has an image of the three-dimensional grille geometry with a total opening value that is larger than every other one of the screenshot three-dimensional grille geometry images, and designate the identified image as a target image for further processing to determine the ventilation grille opening size estimation.

In still another aspect, a non-transitory computer readable medium has stored thereon computer-readable instructions that, when executed by a computer-based processor, cause the computer-based processor to automatically determine a ventilation grille opening size estimation for numerical simulation setup automation based on an input in a computer-implemented environment, by utilizing a process that includes creating screenshots of a plurality of computer-rendered images of a three-dimensional grille geometry, with the three-dimensional grille geometry disposed at a different angle of rotation about a first axis, identifying which, if any, of the screenshots has an image of the three-dimensional grille geometry with a total opening value that is larger than every other one of the screenshot three-dimensional grille geometry images, and designating the identified image as a target image for further processing to determine the ventilation grille opening size estimation.

In some implementations, one or more of the following advantages are present.

For example, certain implementations facilitate the automatic creation of three-dimensional (3D) variable resolution regions for grille geometries that may be utilized in one or more computer-implemented simulations. More particularly, this is done in a manner that results in the simulations being conducted with great efficiency of computational resources—balancing the availability of such resources against the need for precision and detail in such simulations.

Implementations of the system and techniques disclosed herein provide for grille opening calculation/estimation automatically and quickly, whereas some prior approaches tend to be time-consuming, involve manual processes, and/or are inefficient.

Implementations of the systems and techniques disclosed herein help eliminate imprecision and errors in engineers' judgements, for example, when making measurements, estimations, setting VR regions, and/or attempting to simulate a grille or a particular environment that includes the grille. Improved accuracy and consistency may be realized.

Implementations of the systems and techniques disclosed herein facilitate automation of simulation workflows.

Implementations of the systems and techniques disclosed herein overcome technical challenges associated with identifying the location of openings and determining their sizes, especially in the presence of visual noise, such as horizontal/vertical bars and/or vehicle logos, and variations in shape of the grille openings/holes that vary across different vehicle models/designs.

Implementations of the systems and techniques disclosed herein overcome technical challenges associated with spatial calibration being difficult due to a lack of good reference geometries, and the fact that in an automated simulation workflow, manual spatial calibration may not be feasible or practical.

Other features and advantages will be apparent from the description and drawings, and from the claims.

BRIEF DESCRIPTION OF THE DRAWINGS

Like reference characters refer to like elements.

DETAILED DESCRIPTION

Figure 1B:
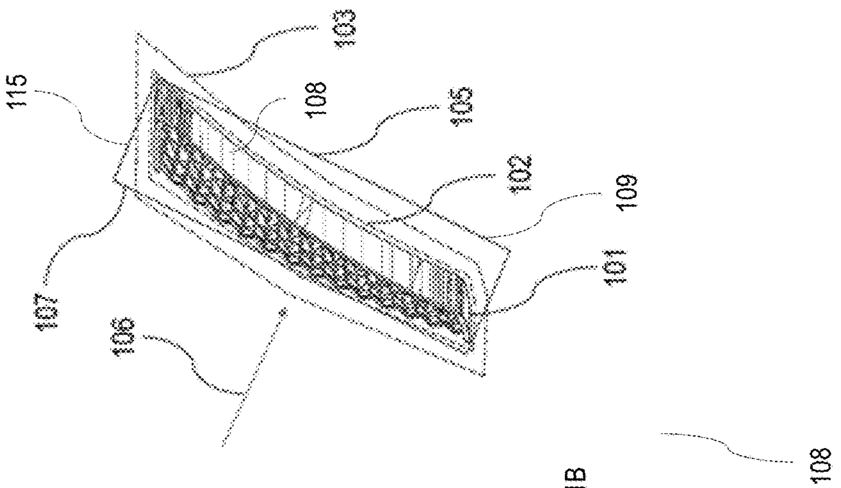
FIGS. 1A and 1B show front and side views of an example of a vehicle grille, an enclosing VR10 region and VR11 region for simulation setup, and an orientated bounding box for the vehicle grille.

This document uses a variety of terminology to describe the inventive concepts set forth herein. Unless otherwise indicated, the following terminology, and variations thereof, should be understood as having meanings that are consistent with what follows.

"Numerical simulation" refers to processes performed by a computer to simulate real-world processes or systems by performing calculations based on mathematical models of the real-world processes or systems.

A "mesh" is network of cells and nodes that support certain numerical simulations in a computer-implemented environment. Typically, each cell in a mesh would represent an individual solution to the simulation and the various individual solutions may be combined to produce an overall solution for the entire mesh.

"Resolution" refers to the density or size of cells (e.g., mesh size) or finite elements represented, for example, in a mesh generated by a computer to support a computer-implemented numerical simulation based on a computer-implemented model of an object or a portion thereof. Resolution can influence efficiency and effectiveness of a computer-implemented simulation. For example, high resolution simulations can produce detailed data but are costly, whereas low resolution simulations tend to be less expensive but produce less detailed data. Utilizing variable resolution ("VR") regions is one way to try to strike a balance between the two.

A "variable resolution region" (or "VR region") is a region (e.g., a flow region) defined in and/or around a modeled object (e.g., a grille) or portion of a modeled object in a computer-implemented simulation involving the modeled object (e.g., the grille or a vehicle or other component that includes the grille), where the resolution of meshes for the simulation vary from one VR region to another VR region. Complex simulations, such as those involving the Lattice-Boltzmann method for example, may assign multiple (e.g., up to eleven or twelve) different VR regions for meshes in a simulation involving a modeled vehicle or heavy-duty industrial machine.

The phrase "opening" or "gap" or "hole" or the like, refers to an aperture in a grille from one side (e.g., a front side) to an opposite side (e.g., a back side) that, in operation, would allow the passage of fluid (e.g., air) through the grille.

A "bounding box" is the minimum or smallest bounding or enclosing box for a point set S in N dimensions (where N may equal three), i.e., the box with the smallest measure (e.g., volume) within which all the points lie. An "oriented bounding box" (or OBB) is the minimum bounding box, calculated subject to no constraints as to the orientation of the result. This contrasts "axis-aligned minimum bounding boxes" in which minimum bounding box subject to the constraint that the edges of the box are parallel to the default or global (Cartesian) coordinate axes.

The phrase "initial viewing vector," refers to a vector that originates outside (and, e.g., in front of) the modeled grille 101 geometry and is directed toward the modeled grille 101 geometry. In general terms, the word "vector" refers to a geometric object that has magnitude (even an arbitrary magnitude) and a direction. In some implementations, the "initial viewing vector" is configured with a direction (i.e., to be directed) towards a face (e.g., a front face) of an oriented bounding box 105 for the grille 101 geometry. Moreover, in some implementations, the "initial viewing vector" is configured to be perpendicular to the front face of the OBB 105. Depending on size and direction, the perspective and direction of the "initial viewing vector" may provide a view through some portion of one or more of the openings in the modeled grille 101 geometry (e.g., from the front of the grille to the back of the grille). In an exemplary simulation, +X direction is pointing toward a vehicle's trunk/rear region from its front bumper. So, the face in the virtual world that has smallest X value corresponds to the front face which, in the real world. "encounters" the air first. As for those grilles located at the rear region (e.g., for some sports car) or on the side (for some machines), the front faces always point towards the exterior region of the car/machine. To determine the inward and outward direction of the car/machine, the computer can implement a ray-casting method to calculate the intersecting location between the ray emitting from the grille and the bounding box of the car/machine.

TECHNICAL DISCLOSURE

In computer-implemented numerical simulation, a computer simulates real-world processes or systems by performing calculations based on computer-implemented mathematical models of the real-world processes or systems. Computer-based numerical simulations may involve discretizing physical space or time represented in the mathematical model with a virtual mesh that includes a network of cells. Calculations to support such computer-implemented numerical simulations may be performed, by the computer, on a per cell basis and then an overall conclusion may be derived, again by the computer, from the totality (or some segment) of the per cell calculation results.

In some computer-implemented numerical simulations, multiple meshes, each made up of a collection of cells, may be applied to discrete physical regions, for example, at or near a surface of a system being modelled. The size, shape, and resolution of each such mesh may be influenced by the size and shape of the system being modeled and/or the aims of the numerical simulation. Moreover, typically, the resolution (e.g., cell size) in a computer-implementation numerical simulation can vary from mesh to mesh. In general, the use of higher resolution meshes tends to produce more detail and information but with low relative efficiency, whereas the use of lower resolution meshes tend to produce less detail and information but with higher relative efficiency. It is generally desirable for mesh size to vary in a manner that balances the interests of producing highly detailed simulation results and doing so efficiency. In a typical computer-implemented numerical simulation, the meshes applied to the different physical region at or near of surface of a system being modeled, for example, are referred to as variable resolution ("VR") regions.

Computational fluid dynamics (CFD) represents a particular form of numerical simulation of fluid dynamics that uses numerical analysis and data structures to analyze and solve problems that involve fluid flows, such as fluid flows through and/or around a grille of an automobile. Computers are used to perform these calculations and store the associated data structures to facilitate simulating the free-stream flow of fluid (e.g., air), and the interaction of the fluid with surfaces of the grille, which may be defined, for example, by data in memory representing boundary conditions.

CFD procedures, according to an exemplary implementation, may include defining the geometry and physical boundaries of a problem and/or system (e.g., a grille and simulating fluid flow conditions through and near the grille), which can be defined using computer-aided design (CAD). From there, data can be processed (cleaned-up) and the fluid volume (or fluid domain) may be extracted. The volume occupied by the fluid under consideration may be divided, by the computer, into discrete cells (a mesh). The mesh may be uniform or non-uniform, structured or unstructured, and consisting of any one or a combination of hexahedral, tetrahedral, prismatic, pyramidal, or polyhedral elements, for example. The physical modeling may be defined using, for example, equations that define, for example, fluid motion, enthalpy, radiation, etc., all of which may be stored in computer memory. Boundary conditions also may be defined in computer memory. This may involve describing fluid behavior and properties at bounding surfaces of the fluid domain. For transient problems, initial conditions also may be defined in computer memory. Once these preprocessing steps are performed, the computer may perform the simulation, with equations being solved iteratively (e.g., on a per cell basis) as a steady-state or transient. Finally, a postprocessor in the computer may be used for analysis and visualization of the resulting solution (which may be a collection or other combination of the individual per cell solutions.

Some such computer-implemented CFD procedures utilize Lattice-Boltzmann methods (LBM). In LBM, fluid density on a lattice may be simulated with streaming and collision (relaxation) processes. These sorts of methods tend to be versatile as modeled fluids can straightforwardly be made to mimic common fluid behavior, and, fluids in complex environments can be straightforwardly simulated, whereas other CFD methods can be hard to work with where complex boundaries are involved.

In some computer-implemented procedures, varied meshing sizes may be applied in different fluid regions (e.g., around a grille) to optimize computational resources in these (and other) types of simulations. These regions, again, may be referred to as variable resolution (or "VR") regions. Some such regions may have sizes and shapes that are defined by separate referencing geometries. In LBM-based simulations, different VR regions may have different lattice refinement sizes at different levels (e.g., in the different VR regions). For a standard vehicle simulation using LBM, for example, up to 11 or 12 levels of VR regions may apply (or be available to apply) in the simulation domain depending, for example, on the specific application at issue (e.g., aerodynamics, thermal management, aeroacoustics). A higher VR level generally means a finer mesh is applied in that VR region. A lower VR level generally means that a coarser mesh is applied in that VR region. Computational cost may be significantly affected by the finest VR level used and by the VR region sizes. Thus, best practices are usually utilized with the aim of avoiding over-resolving any fluid regions.

Among all critical regions of a vehicle, the grille is one that tends to need finer resolution mesh(es) in order to fully capture flow gradient(s) (e.g., across the narrow gaps/holes 104 that are present in typical grille 101 designs). (See, e.g., FIGS. 1A and 1). As a result, finer mesh VRs tend to get applied in simulations around the area of a vehicle's grille. More specifically, in a typical LBM simulation, two of the finest variable resolution VR regions (e.g., VR10 103 and VR11 102) may be applied to enclose the vehicle's grille 101, as illustrated schematically in FIGS. 1A and 1B. VR11 102 is closer to the grille 101 than VR10 103 in the illustrated implementation. As such, VR11 102 more closely envelops the grille 101 than does VR10 103. Each of VR11 102 and VR10 103 approximates the overall shape of the grille, without regard to the narrow gaps/holes 104 in it). Most of the time, meshing size used in VR11 is 1 mm and mesh sizing in VR10 is 2 mm. Although this rule-of-thump strategy simplifies simulation setup, it could potentially waste simulation resources (e.g., if the grille opening size is large enough that only VR10 (and not VR11) is adequate). A minimum 8 voxels is usually required to resolve the flow across the grille. Thus, in some instances, VR11 enclosing the grille may no longer be needed (e.g., if the opening size is larger than 16 mm). Variable resolution regions VR10 103 and VR11 102 are shown as enclosing the vehicle's grille 101 in FIGS. 1A and 1B. VR10 102, which may have 1 mm mesh sizing, is closer to the grille 101 than VR11 102, which may have 2 mm mesh sizing.

Figure 1A:
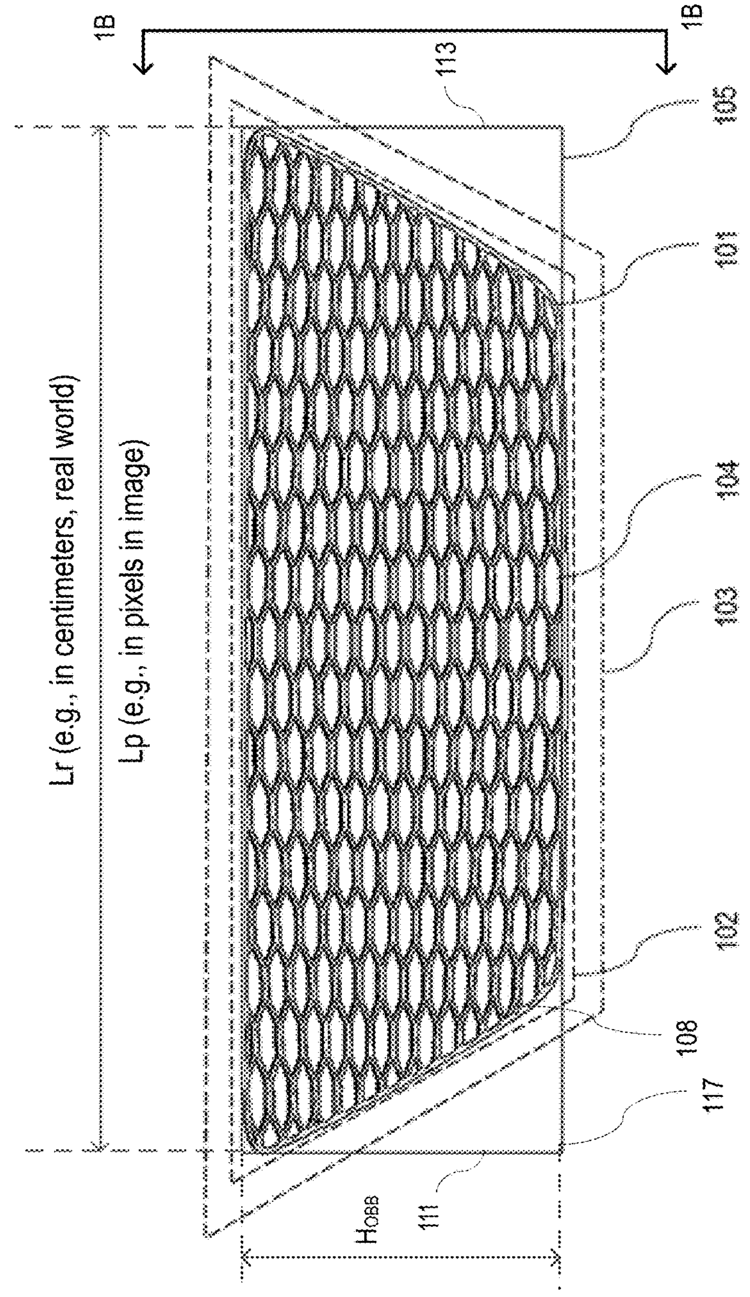

The grille 101 represented in the illustrated image (which may appear on a computer screen as a rendering of a CAD or mesh file) has a rigid body that is contoured to define an outer rim 108 that surrounds an internal portion with structures that define a honeycomb pattern of substantially uniform gaps/holes 104 that extend through the grille 101 (e.g., from a front face of the grille, which is visible in FIG. 1A, to a rear face of the grille, which is opposite the front face). In fact, every gap/hole 104 in the internal portion of the illustrated grille 101 is the same as or similar to all the other gaps/holes 104 in the internal portion, except at the edges (top, bottom, and sides) of the internal portion, where some of the gaps/holes 104 are cut off by the outer rim 108. As shown in the side view of FIG. 1B, a front surface of the internal portion of the grille 101 extends forward a bit from a forward edge of the outer rim 108. From an aesthetic perspective, the visual effect produced by the pattern may be pleasing or appealing to the viewer. From a functional perspective, the pattern provides air flow communication channels through the grille into a vehicle's underhood region, for example. This air flow typically helps to remove the heat out of the vehicle when operating and particularly while the vehicle is in motion under the influence of the engine or electric motors. The narrow gaps/holes 104 in the grille 101 allow for air to flow from outside the vehicle, through the grille 100 in a roughly horizontal direction (e.g., left to right in FIG. 1*i*), and into the vehicle's underhood region.

An oriented bounding box 105 is shown in the illustrated implementation. In general, a bounding box is a virtual box that surrounds and defines the minimum or smallest bounding or enclosing box for the set of points that make up the grille model. Bounding boxes can be aligned axially (e.g., with edges that lie parallel to cartesian coordinate axes arranged parallel to and perpendicular to the direction of gravity, for example). Alternatively, and as represented in the illustrated implementation, a bounding box can be oriented relative to the grille 101 design in a manner (as shown), which would minimize the internal volume of the bounding box.

Thus, the illustrated OBB 105 defines the minimum or smallest bounding or enclosing box for the set of points that make up the car model with the smallest volume within which all the points lie. The illustrated OBB 105 is a square cuboid with a front surface that contacts a frontmost point of the modeled grille 101, a rear surface that contacts a rearmost point of the modeled grille 101, side surfaces that respectively contact furthest points on either side of the modeled grille 101, a bottom surface that contacts a lowest point of the modeled grille 101, and a top surface that contacts a highest point on the modeled grille 101. In some implementations, one or more of the bounding box surfaces may contact more than one point on the modeled grille 101 if those points are all lie in the same plane and include the furthest point in that dimension. Dimensions of the OBB 105 implicitly define an overall length, height, and width of the modeled grille 101.

An initial viewing vector 106 also is shown in the illustrated implementation. The viewing vector is a vector that originates outside (and in front of) the modeled grille 101, is directed toward a front face of the grille 101 and is oriented perpendicular to a front face 107 of the OBB 105. Viewing the modeled grille 101 from the viewing vector 106 enhances the likelihood that one would see as much as possible through the gaps/holes 104 in the grille 101 given the depth (e.g., dimension into the page in FIG. 1A) and contours of the structure that defines the gaps/holes 104.

There are a variety of ways to measure opening sizes in a grille. Each prior method has shortcomings.

For example, manual measurement is a relatively easy way to determine the opening size for a grille. However, with varied designs and vehicle models, opening sizes in grilles may vary and VR assignment based on size opening may be subject to an engineer's subjective and sometimes imprecise and inconsistent judgement to determine which size should be used for determining VR assignments. In addition, depending on the 3D shape of the opening, manually measuring the size could introduce human errors as picking two points for distance measurements can be somewhat subjective. Moreover, manual measurement of a size and then manual assignment of the VR region may not be feasible or practical (from a speed or efficiency perspective) in an automated workflow in which manual inputs are desirably minimized. Thus, an automated method to accurately measure the opening size is needed to facilitate simulation workflow automation and to reduce uncertainties from any human factors.

This goal could be possibly achieved by analyzing the 3D geometry, identifying possible gaps and then attempting to calculate the size of the gap. For example, rays could be emitted from centroids of all triangles if the geometry has been triangulated and gap sizes can be determined by measuring the traveling distances of these rays. Although algorithms such as octree could be used to improve the performance of this ray-tracing method, determining if the returned distances belong to the target gap/opening is still challenging. Another method may be to identify two sets of points from two objects and then utilize Delaunay tetrahedralization to calculate the gap between these two objects or two points. (See, e.g., S. Goswami, G. Burenkov, 2022, "Detection of gaps between objects in computer added design defined geometries", U.S. patent application Ser. No. 16/504,599.) However, user inputs are usually needed to define thresholds of gap distance and the angle formed by these two objects, which is less than desirable for simulation workflow automation purposes.

Implementations of the systems and/or techniques disclosed herein address and/or solve one or more of these technical challenges/problems.

Moreover, it is difficult to utilize three dimensional (3D) shape analysis of grille geometries to identify location and size of gaps/holes in a grille, particularly with the presence of visual noise and/or obstructions, such as horizontal/vertical bars and/or vehicle logos that may be incorporated in or mounted to the grille. Implementations of the systems and techniques disclosed herein account for such challenges.

Additionally, the shape of grille openings/holes can vary across vehicle models/designs. For example, grille openings in different vehicle models/designs can be rectangular, hexagonal, and circular and so on. These variants introduce extra challenges when trying to detect the overall size of the opening. Implementations of the systems and techniques disclosed herein facilitate estimating identifying appropriate VR assignments even in view of such challenges.

Moreover, depending on the orientation of the grille and possible inclination of planar plates when an active grille shutter is present, for example, the opening size may look smaller visually when the viewing angle is parallel to the vehicle moving direction. This introduces challenges when analyzing the grille opening size use any image processing techniques directly. Implementations of the systems and techniques disclosed herein address and overcome these technical issues.

Additionally, when using image processing method to analyze the shape or determine the actual opening size, spatial calibration can be difficult due to a lack of good reference geometries. In an automated simulation workflow in fact manual spatial calibration is not particularly feasible. Implementations of the systems and techniques disclosed herein address and overcome these technical issues.

Moreover, creating an image of the grille with the optimized viewing angle in a computer program so that a program can perform analysis of the image and determine an opening size can be challenging with known techniques. Implementations of the systems and techniques disclosed herein address and overcome these technical issues.

Additionally, implementations of the systems and techniques disclosed herein may be able to identify the contour of the openings and determine overall opening size in the presence of noise, and/or handle grilles with varied orientations and designs.

Other technical issues and problems may be addressed herein as well.

In some implementations, the systems and techniques disclosed herein may be integrated into automated computational fluid dynamics (CFD) simulation workflows (e.g., implemented by computer software executing on a computer to perform CFD simulation) to automatically assess and/or determine a value to be used as an opening size for a vehicle grille so that correct VR regions can be assigned to the grille region in order to optimizes simulation resources in the CFD simulation. In some implementations, the systems and techniques disclosed herein may be utilized to detect the opening size of any equipment or device which is designed for ventilation.

Exemplary Computer Environment

Figure 8:
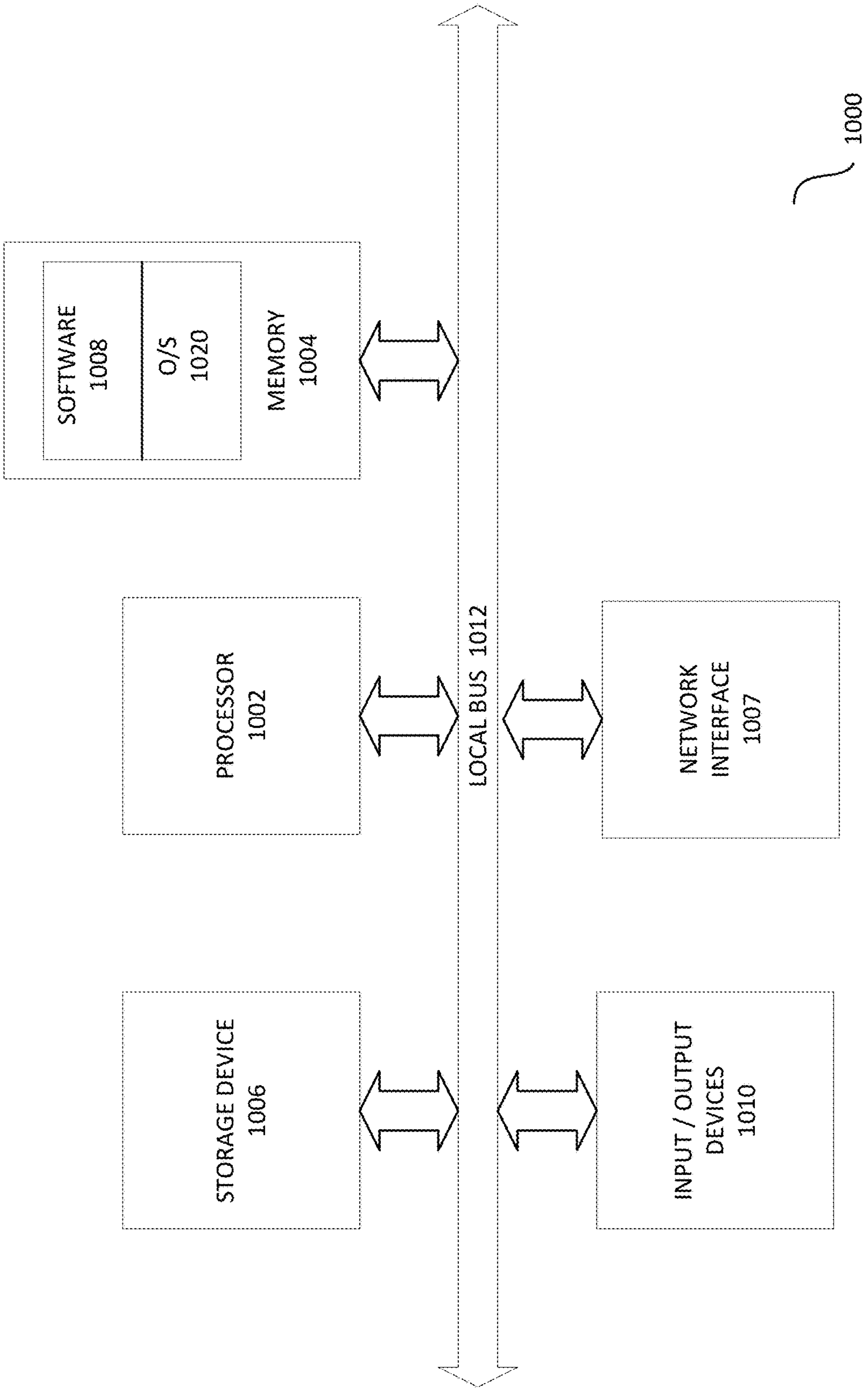
FIG. 8 is a schematic representation of a computer configured to perform functionalities disclosed herein.

FIG. 8 is a schematic representation of an exemplary implementation of a computer 1000 that is configured to automatically determine a value representing opening size for a vehicle's grille based on a computer-based representation of the grille's geometry. In some implementations, this determination facilitates or enables automatic assignment (e.g., by the computer 1000) of one or more three-dimensional (3D) variable resolution (VR) regions at or near the grille to be used in a computer-based simulation (e.g., CFD) involving the grille so as to appropriately balance the competing interests of precision and efficiency.

The illustrated computer 1000 has a processor 1002, computer-based memory 1004, computer-based storage 1006, a network interface 1007, an input/output device interface 1010, and an internal bus 1012 that serves as an interconnect between the components of the computer 1000. The bus 1012 acts as a communication medium over which the various components of the computer 1000 can communicate and interact with one another.

The processor 1002 is configured to perform the various computer-based functionalities disclosed herein as well as other supporting functionalities not explicitly disclosed herein. Some of the computer-based functionalities that the processor 1002 performs are those functionalities disclosed herein as being specifically attributable to the computer 1000 (or to processor 1002). In some implementations, the processor 1002 performs these and other functionalities by executing computer-readable instructions stored on a computer-readable medium (e.g., memory 1004 and/or storage 1006). In various implementations, some of the processor functionalities may be performed with reference to data stored in one or more of these computer-readable media and/or received from some external source (e.g., from an I/O device through the I/O device interface 1010 and/or from an external network via the network interface 1007). The processor 1002 in the illustrated implementation is represented as a single hardware component at a single node on a network. In various implementations, however, the processor 1002 may be distributed across multiple hardware components at different physical and network locations/nodes.

The computer 1000 has both volatile and non-volatile memory/storage capabilities (e.g., in memory 1004). As shown, memory 1004 is configured to host the computer's operating system 1020 as well as executable software 1008. In a typical implementation, memory 1004 serves as a computer-readable medium storing computer-readable instructions that, when executed by the processor 1002, cause the processor 1002 to perform one or more of the computer-based functionalities disclosed herein. More specifically, in some implementations, memory 1004 stores computer software that enables the computer 1000 to perform various functionalities disclosed herein including, for example, determining a value to represent opening size for a vehicle's grille based on a computer-based representation of the grille's geometry (e.g., stored as a CAD file in computer memory), and/or automatically identifying and assigning one or more three-dimensional (3D) variable resolution (VR) regions (based on the determined value for opening size) at or near the grille to be used in a computer-based simulation involving the grille, and/or conducting a computer-based simulation involving the grille utilizing one or more of the assigned 3D VR regions at or near the grille. In various implementations, this computer software may be a stand-alone component, but in other implementations, this computer software may be integrated into, and/or be designed to be and operable to be utilized in connection with, another software program stored in memory 1004 to facilitate and perform computer-based simulations that utilize either the computed values for opening size, VR region assignments (based on the computed opening sizes), or both in running simulations based on a grille's geometry.

For example, in certain implementations, the aforementioned computer software may be integrated into PowerFLOW® simulation software available from Dassault Systèmes Simulia Corp. PowerFLOW® simulation software provides unique solutions for computational simulation of fluid-flow problems. It is suitable for a wide range of applications, whether simulating transient or steady-state flows. Using an enhanced particle-based method based on DIGITALPHYSICS® technology, PowerFLOW offers a wide range of modeling and analysis capabilities, including aerodynamics simulations, thermal simulations (including, e.g., convection, conduction, radiation, and heat exchangers), and aeroacoustics simulations. PowerFLOW® simulation software is able to simulate fluid-flow design problems in such industries as automotive and other ground transportation, aerospace, petroleum, building design and architecture/engineering/construction (AEC), heating, ventilating, and air conditioning (HVAC), and electronics. Automotive applications include, for example, full car external aerodynamics for drag and lift, underbody design, noise source identification or aeroacoustics for side mirror, antenna, glass offset and detail design, wind tunnel design and validation, intake ports, manifolds, heating, and air conditioning ducts, under hood cooling, filter design, and windshield wiper design, etc. A program such as PowerFLOW® simulation software, for example, adapted to incorporate the techniques disclosed herein, may have the ability, when executed by computer, to automatically determine a value representing opening size in a vehicle grille, to facilitate and/or automatically assign three-dimensional (3D) variable resolution (VR) regions at or near the grille (e.g., for computer-based simulation purposes), and/or to run simulation(s) of the grille based on the assigned 3D VR region(s).

The computer 1000, in the illustrated implementation, also has a storage device 1006, which can be virtually any form of computer-based storage device or component.

Figure 2:
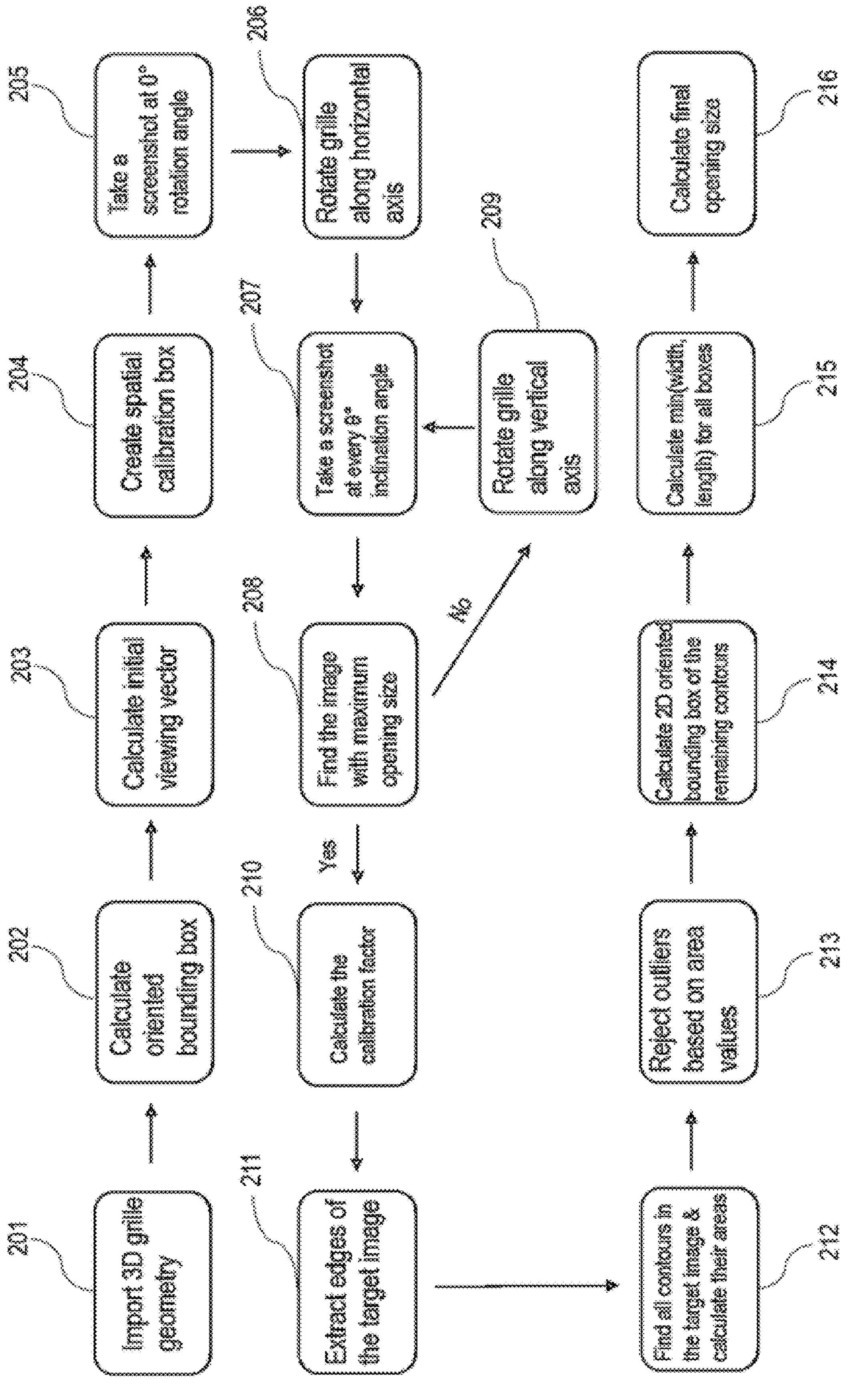
FIG. 2 is a flowchart representing an example of a processes of automatic determination of opening size of a ventilation grille.

FIG. 2 is a flowchart representing an exemplary implementation of a process for determining a value representing size of the openings in a grille based on a virtual, three-dimensional, computer-based representation of the grille including its geometry. In some implementations, this value can be utilized to facilitate and/or enable automatic, or at least simplified, assignment of one or more three-dimensional (3D) variable resolution regions at or near the grille for use in connection with simulating the grille in a computer-based environment (e.g., from a computational fluid dynamics perspective). In an exemplary implementation, the process represented by the illustrated flowchart is implemented within a computer-based environment, such as on computer 1000 of FIG. 8, with the illustrated processing steps being performed by or with the assistance or involvement of processor 1002.

The process, according to the illustrated flowchart, includes (at 201) importing a three dimensional (3D) grille geometry. In a typical implementation, this importing step includes importing a computer-based representation of the 3D grille geometry (e.g., from one application to another). The source (or origin) application in this case may be, for example, the software application where the computer representation of the 3D grille geometry was created and/or stored. This may be a computer-aided design (CAD) application, such as SOLIDWORKS® CAD software, available from Dassault Systèmes. The destination application in this case would be the software application where the processes otherwise represented in FIG. 2 would occur (e.g., where the computer representation of the 3D grille geometry is processed and analyzed as described herein). In one particular example, the destination application may be PowerFLOW® simulation software, also available from Dassault Systèmes, adapted to include the functionalities represented in FIG. 2 and described herein. The destination application may include a geometry tool or a geometry viewer that facilitates viewing a visual representation of the 3D grille on a computer screen (e.g., connected to 1010 in FIG. 1). The 3D grille geometry may be contained in a CAD or mesh file imported from a geometry program, for example at step 201.

In some implementations, the importation process (at 102) is performed by a computer (e.g., 1000) automatically. In some implementations, the importation process (at 102) is performed in response to a human user selecting an import option (e.g., at a user interface of computer 1000) or taking some other step or combination of steps to initiate importation. In an exemplary implementation, the importation process will result in importing data representative of the grille 101 design shown in FIGS. 1A and 1B. The data that gets imported (at step 201), however, typically will not include information representing the OBB 105, the viewing vector 106, or any of the 3D VR regions 102, 103. In an exemplary implementation, the data representative of the grille 101 geometry shown in FIGS. 1A and 1B will be imported from, or in the form of, a CAD file.

Next, according to the illustrated flowchart, the computer 1000 (at 202) calculates an oriented bounding box (OBB) 105 for the imported grille (e.g., 101) geometry. This step, in a typical implementation, involves determining virtual parameters for the OBB 105, relative to the imported grille 101 design, to fully define the OBB 105, as shown in FIGS. 1A and 1B. The OBB 105 typically is generated directly from the imported grille (e.g., 101) geometry. In this regard, the computer 1000 stores computer executable instructions that, when executed by the computer processor 1002, causes the computer processor 1002 to automatically generate the OBB 105 parameters (and, optionally, a visual representation of the OBB 105, e.g., as shown in FIGS. 1A and 1B) based on the imported grille (e.g., 101) geometry.

In some implementations, the computer 1000 calls on this OBB-generating functionality automatically (e.g., in response to the modeled grille (e.g., 101) being imported at 201). In some implementations, the computer 1000 calls on the OBB-generating functionality in response to an external prompt from a human user, for example. In the latter cases, the computer 1000 may be configured to present a user-selectable option at its user interface, the selection of which, by a human user, causes the computer 1000 to call on the OBB-generating functionality to then automatically generate the OBB 105 based on the imported grille geometry.

There are a variety of minimum bounding box algorithms that the computer 1000 may apply to a data set representing the imported grille geometry to generate the OBB 105.

For example, the computer 1000 may apply a rotating calipers algorithm to the imported grille geometry data set. This rotating calipers algorithm may be based on an approach described in an article by Joseph O'Rourke in 1985 at pages 183-199 of the *International Journal of Computer & Information Sciences*, entitled *Finding Minimal Enclosing Boxes*. This approach is based on lemmas characterizing the minimum enclosing box as follows: 1) there must exist two neighboring faces of the smallest-volume enclosing box which both contain an edge of a convex hull of the point set (this criterion may be satisfied by a single convex hull edge collinear with an edge of the box, or by two distinct hull edges lying in adjacent box faces); and 2) the other four faces need only contain a point of the convex hull (the points which they contain need not be distinct: e.g., a single hull point lying in the corner of the box already satisfies three of these four criteria). (See also Shamos, M., 1978. "Computational Geometry," Yale University. pp. 76-81).

It is also possible to approximate the minimum bounding box volume, to within any constant factor greater than one, in linear time. One algorithm for doing this involves finding an approximation to the diameter of the point set, and using a box oriented towards this diameter as an initial approximation to the minimum volume bounding box. Then, this initial bounding box is partitioned into a grid of smaller cubes, and grid points near the boundary of the convex hull of the input are used as a coreset, a small set of points whose optimum bounding box approximates the optimum bounding box of the original input. Finally, O'Rourke's algorithm (mentioned above) may be applied to find the exact optimum bounding box of this coreset.

Once calculated (at step 202), the OBB 105 may be stored as data (e.g., in computer memory 1004). Moreover, in some implementations, the computer 1000 may be configured to produce a visual representation of the OBB 105 on a computer display screen (e.g., coupled to 1010) and that visual representation may appear like the visual representation of the OBB 105 in FIGS. 1A and/or 1B. Moreover, in some implementations, the computer 1000 may be configured to present a visual representation of the OBB 105 on its display. In some implementations, the visual representation of the OBB 105 is presented along with an image of the grille 101 geometry associated with the OBB 105. In some implementations, various other information (e.g., dimensions such as length, height, and/or width) and/or location information of the corner nodes of the OBB 105 may be displayed or accessible to the user through the user interface on the display.

In a typical implementation, the OBB 105 is a six-sided, 3D box, where each side (or face) is perpendicular to any adjacent sides (or faces). An example of this is shown in FIGS. 1A and 1B, where the OBB 105 is 3D and has six sides (or faces)—a front face 107, a rear face 109, a right side face 111, a left side face 113, a top face 115, and a bottom face 117. Each of these faces 107-117 is perpendicular to an adjacent one of the faces. For example, the front face 107 of the OBB 105 is perpendicular to adjacent top face 115, adjacent bottom face 117, and the adjacent side faces 111, 113.

Next, according to the process represented in the illustrated flowchart, the computer 1000 (at 203) calculates the initial viewing vector 106. In a typical implementation, the computer 1000 calculates the initial viewing vector 106 using the grille's O+BB 105 information. There are a variety of ways in which the computer 1000 may calculate the initial viewing vector 106 using the grille's OBB 105 information. For example, most of the time, the grille under consideration is a front grille, and the vehicle is, by typical convention, arranged (e.g., as shown) always along X direction. So, the computer 1000 may, in those implementations, simply use +X direction as the viewing direction. Moreover, geometry tools typically have a "zoom to fit" function built-in. So, the computer 1000 can be made to set +X direction as the viewing direction and use that zoom to fit to create a perfect view of the grille. Moreover, in certain implementations, once the computer 10000 has obtained the OBB information, the system can designate the center of the OBB as a starting point, and the direction of the vector will be perpendicular to the OBB's front face.

In a typical implementation, such as the one represented in FIGS. 1A and 1B, the initial viewing vector 106 is perpendicular to and directed towards the front face of OBB 105 to ensure that the chance for openings to be visible (and able to be seen through) in the starting image taken in step 205 is relatively high.

In some implementations, the computer 1000 may be configured to present a visual representation of the initial viewing vector 106. In some implementations, the visual representation of the initial viewing vector 106 may appear in the same way that the initial viewing vector 106 appears in FIG. 1B, namely with the initial viewing vector 106 appearing along with an image of the grille 101 geometry and the associated OBB 105. In some implementations, various other information (e.g., dimensions such as length, height, and/or width) and/or location information of the corner nodes of the OBB 105 may be displayed or accessible to the user through the user interface on the display.

Next, according to the illustrated flowchart, the computer 1000 (at 204) creates a spatial calibration box 302. Essentially, to measure a distance using an image, the relationship (or ratio) between the pixel domain (e.g., the image of the grille) and the physical domain (e.g., the real world version of the modeled grille) needs to be established. This process is called spatial calibration, and the relationship/ratio sought after in this regard is represented by a conversion ratio or calibration factor (and may be referred to as the pixel-to-real-distance ratio).

In an exemplary implementation, the computer 1000 calculates the pixel-to-real-distance ratio by Eq. 1:

$$R = \frac{L_r}{L_p} \quad (1)$$

where $L_r$ is a real world length of the modelled object (e.g., grille) and $L_p$ is a corresponding length in pixels as shown in the image of the modelled object. This calibration factor may change if, for example, the image of the object is rotated (e.g., on screen) due to the change of visible pseudo size in the unit of pixel as displayed in the image.

Figures 3A, 3B, 3C:
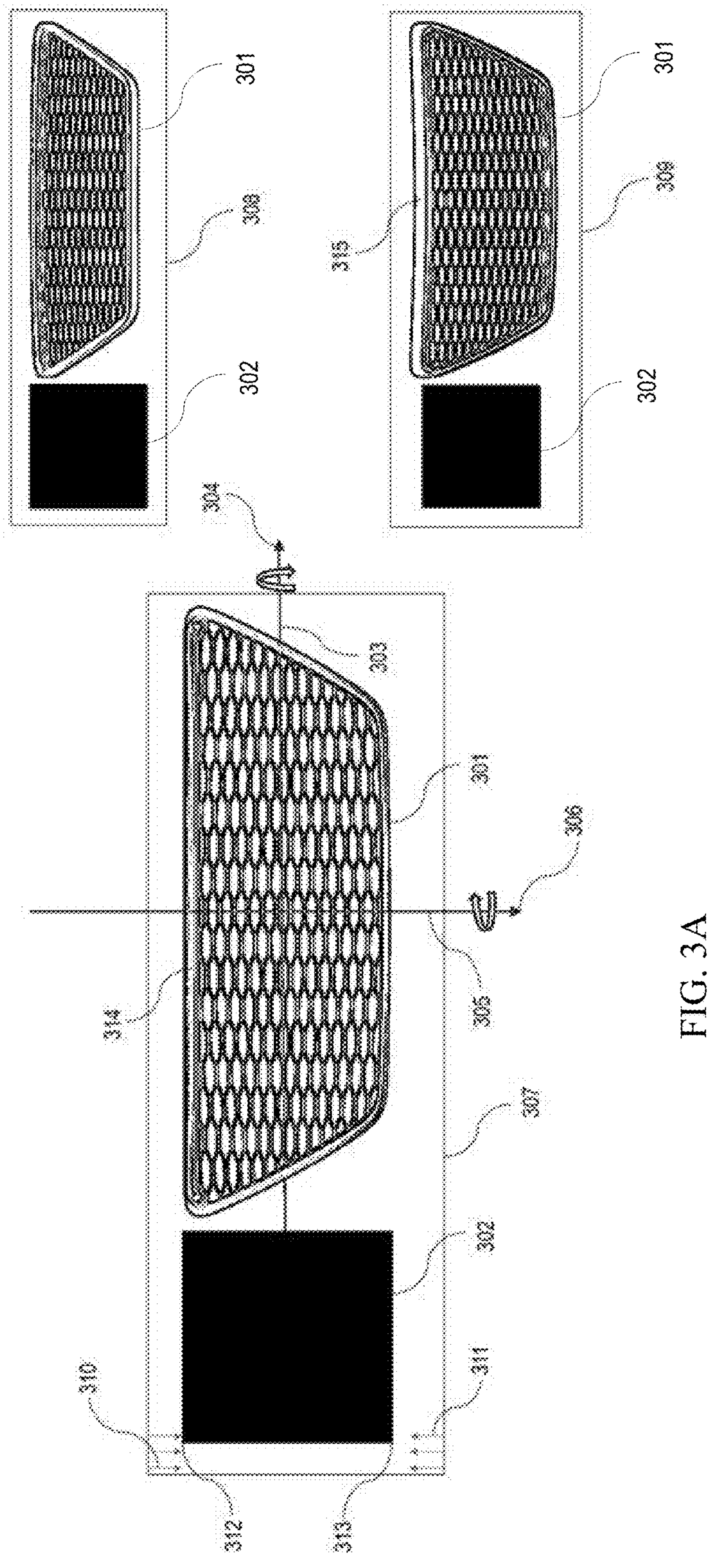
FIGS. 3A-3C shows example of images of a grille and a spatial calibration box generated at varied rotating angles.
Figure 4B:
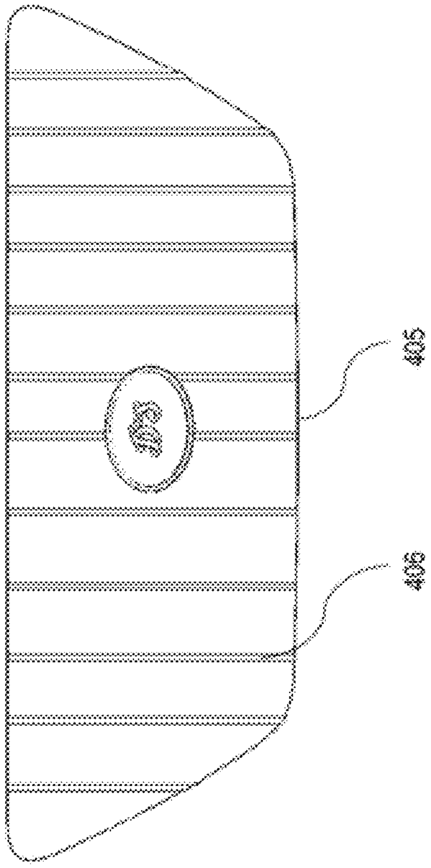
FIGS. 4A and 4B shows different grille designs with horizontal and vertical bars.
Figure 4A:
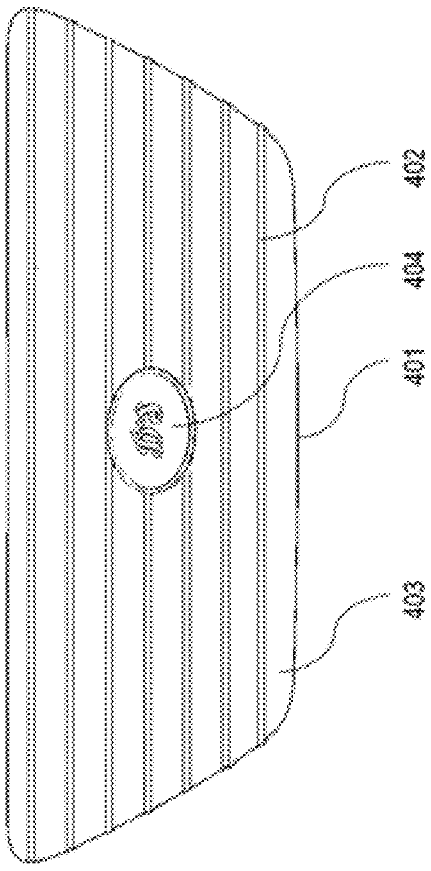

There are a variety of ways in which the spatial calibration box 302 may be created. Typically, the spatial calibration box 302 is as shown in FIG. 3A-3C and is a 3D box with a very small thickness (e.g., 1 millimeter) or a two-dimensional (2D) square. The computer 1000 sets the height ($H_{SCB}$) and width ($W_{SCB}$) of the spatial calibration box 302 equal to the height ($H_{OBB}$) of the OBB 105. The computer 1000 locates a geometric center of the spatial calibration box 302 to the left (or right) of the image of the grille 301 geometry (as shown in FIGS. 3A, 3B, and 3C), but aligns the geometric center of spatial calibration box 302 with the center of the front face 107 of OBB 105. This thin calibration box 302 is necessary because the grille 301 geometry itself cannot be used for calibration purpose during the rotation process even if its dimensions are known. The reason is that the grille 301 usually has a non-trivial thickness such as visible at 314. This thickness creates an artificial volume in the image which may increase the grille 301 geometry's apparent height or width artificially as illustrated by comparing the change in the appearance of the grille's thickness from 314 (in FIG. 3A) to 315 (in FIG. 3C) as the image of the grille 301 geometry is rotated (about horizontal axis 304).

FIG. 3A is a view showing an exemplary spatial calibration box 302 next to a front view image of a grille 301 geometry that may have been generated from grille geometry data imported at 201. Grille geometry 301 in FIGS. 3A-3C is similar to grille geometry 101 view in FIG. 1A. Two of the vertices of the spatial calibration box 302 are marked as 312 and 313 in FIG. 3A. Also shown are two axes of rotation: a horizontal axis of rotation 304, and a vertical axis of rotation 306. Each of these axes 304, 306 passes through the image of the modelled grille 301 (e.g., through the geometrical center of the image of the modelled grille 301).

FIG. 3B shows an image 308 that is similar to the image in FIG. 3A in that it shows an image of the spatial calibration box 302 next to a front view image of the grille 301 geometry. Likewise, FIG. 3C shows an image 309 that is similar to the image in FIG. 3A in that it shows an image of the spatial calibration box 302 next to a front view image of the grille 301 geometry. The images 308 and 309, however, are example ones generated from backward (clockwise) and forward (counter-clockwise) rotations (about horizontal axis 304) of the image 307 in FIG. 1. The view of the grille 301 geometry and the openings in the grille 301 appear different—in size and shape as the image is rotated about the horizontal axis, as indicated.

In a typical implementation, the computer 1000 is configured to produce a sequence of images, such as those represented in FIGS. 3A, 3B, and 3C by rotating the starting image (e.g., about the horizontal axis 304) either backwards or forwards or both. Moreover, the computer 1000 may be configured to take a screenshot of the image at each angle of rotation, including whatever the initial angle (which may be designated as 0 degrees, arbitrarily). The screenshots may be saved (e.g., in memory 1004) as they are created. This produces a series of images of the grille 301 geometry and the spatial calibration box 302 next to the grille 301 geometry at different angles of rotation (about a common axis, e.g., the horizontal axis 304).

Referring again to the flowchart of FIG. 2, the computer 1000 (at 205) takes a screenshot of the grille 301 and the spatial calibration box 302 with them present at the same time on the display screen and with a rotation angle of zero degrees. This rotation angle (zero degrees) may correspond, in most instances, to a view of the grille 301 and the spatial calibration box 302 from the perspective of and in the direction defined by the initial viewing vector 106 calculated at 203. Thus, the viewing angle used for generating this screenshot is determined by the initial viewing vector 106. The image thus captured may be designated as a first or primary image 307 in a sequence of images showing the grille 301 and the spatial calibration box 302 at different rotational angles (rotated about the horizontal axis 304).

Next, according to the illustrated flowchart, the computer 1000 (at 206) rotates the image of the grille 301 geometry and the spatial calibration box 302. In one implementation, this rotation occurs about the horizontal axis 304. However, in other implementations, the rotation occurs about the vertical axis 306 instead. The direction of rotation can be forward (represented by the curved arrow around the horizontal axis 304 in FIG. 3A) or backwards (opposite the curved arrow around the horizontal axis 304 in FIG. 3A). The angular amount by which the computer rotates the image (at 206) can vary. In various implementations, the angle is one degree or less, two degrees or less, three degrees or less, four degrees or less, five degrees or less, ten degrees or less, etc.

In an exemplary implementation, the rotation (e.g., a forward one, about horizontal axis 304) changes the visual appearance of the image from what it appears like in FIG. 3A (307) to what it appears like in FIG. 3C (309). As can be seen, even though the grille 301 geometry is the same in these two images 307 and 309, its appearance (including how much of the openings in the grille can be seen through) changes because of the change in perspective and viewing angle relative to the grille 301. Other changes are apparent also. For example, the appearance of the grille's thickness increases from 314 (in view 307 of FIG. 3A) to 315 (309 in FIG. 3C) as the image of the grille 301 geometry is rotated forward (about horizontal axis 304).

Once the image has been rotated (e.g., from the view 307 in FIG. 3A to the view 309 in FIG. 3C), the computer 1000 (at 207) takes a new screenshot of the new view (309). The computer 1000 typically stores the new screenshot in memory (e.g., 1004) together with the original screenshot (taken and saved at 205).

Typically, steps 206 and 207 are repeated multiple times with the same image with screenshots taken at different angles of rotation to produce a sequence of multiple different images showing the same grille 301 geometry from different perspectives/viewing angles. Each of these screenshots may be stored together in memory (e.g., 1004). In some implementations, the different perspectives/viewing angles results from the computer 1000 rotating the image forward for each screenshot a little farther than the previous screenshot. In some implementations, the different perspectives/viewing angles results from the computer 1000 rotating the image backward for each screenshot a little farther than the previous screenshot. In some implementations, the different perspectives/viewing angles may result from the computer 1000 rotating the image forward and backward different amounts relative to the viewing angle and perspective of the original screenshot (taken and saved at 205).

The foregoing approach can be helpful, for example, because depending on the specific grille design and its orientation, the image 307 generated using the initial viewing vector 106 may not be best image to analyze the opening size. One reason for this is that the opening holes might be blocked (e.g., by surrounding structures) leading to misleadingly small openings being displayed in the image. Significant errors may be introduced if such an image (e.g., with misleadingly small opening sizes displayed) is used to calculate opening size(s). When opening sizes are measured manually (e.g., by an engineer in the real world), the engineer may rotate the real world grille to find the best viewing angle before actually measuring the opening size(s). To mimic this process, the computer 1000 rotates the image of the grille 301 geometry—pivoted at its geometric center about its horizontal axis 304 in step 206. The camera viewing angle and location (i.e., the perspective from which the screenshots are taken at 207) is kept unchanged during the geometry rotating process. A screenshot containing the grille 301 and calibration box 302 is taken at every 0° rotation angle (at 207). The value of 0 may be optimized to balance the performance and accuracy. The rotation may happen in clockwise and counter-clockwise directions or both sequentially depending, for example, on at what angle the target image is found. Again, images 308 and 309 are example ones generated from backward (clockwise) and forward (counter-clockwise) rotations.

Once the computer 1000 has produced the multiple different images showing the same grille 301 geometry from different perspectives/viewing angles, the computer 1000 (at 208) identifies which one of those images has the largest opening size(s). This process is discussed further below. If none of the images can be identified as having the largest opening size(s) (at 208), then, according to the illustrated flowchart, the computer 1000 progresses to step 209 and rotates the image of the grille geometry (e.g., initial image 307) along the vertical axis 206 (at 209), taking a screenshot 207 at every 0° rotation angle (207), to produce a new series of images that show the grille 301 geometry alongside the spatial calibration box 302 at different angles of rotation about vertical axis 306. After producing this new set of images, the computer 1000 returns to step 208 and attempts to find the image with the maximum opening size—this time among the new collection of screenshot images—showing the same grille geometry from different viewing angles and perspectives—now, rotated about the vertical axis 206 instead of the horizontal axis 204.

In a typical implementation, once identified (at 208), the image that has the largest (or maximum) opening size, the computer saves or flags that image with a designation in memory indicating that characteristic.

Next, according to the illustrated flowchart, the computer 1000 (at 210) calculates a calibration factor (or pixel-to-real-distance ratio) for the image that was determined (at 208) as the one having the maximum opening size. Since the physical height of the spatial calibration box 302 is known already (and stored in memory, e.g., 1004) from step 204 when it was created, only its height in the unit of pixel is needed to be determined. In one embodiment, this may be calculated by a process that involves casting rays (310, 311) from and near the upper corner of the display screen in a vertically downward direction (see rays 310 in the image 307 in FIG. 3A), and from the lower corner of the display screen in a vertically upward direction (see rays 311 in the image 307 in FIG. 3A). The corners from which these rays (310, 311) are cast are the corners on the spatial calibration side of the display screen (i.e., the side of the grille 301 geometry where the spatial calibration box 302 is located).

In some implementations, one ray at a time may be cast from the upper edge of the image 307 and from the lower edge of the image 307. For example, in the illustrated implementation, the first of each ray cast the upper edge and the lower edge may be closest to the leftmost edge of the image 307 and each subsequent ray may be cast originating at points on the upper and lower edges that are some number (one or more) pixels next to the previous ray—towards the spatial calibration box 302. In some implementations, multiple rays (separated from one another in a lateral direction by some number of pixels (one or more)) may be cast simultaneously from the upper edge of the image 307 in a downward direction and simultaneously from the lower edge of the image 307 in an upper direction.

If a particular one of the cast rays never strikes or reaches a pixel that is darkened, then, in a typical implementation, the computer 1000 may conclude that no portion of the spatial calibration box 302 lies along the path traversed by that cast ray. For example, the leftmost rays (downward cast and upward cast) in FIG. 3A would traverse the entirety of the image 307 without reaching a darkened pixel. When that happens, the computer 1000 concludes that no portion of the spatial calibration box 302 lies along the paths traversed by those leftmost rays. If, on the other hand, a particular one of the cast rays strikes or reaches a pixel that is darkened, then, in a typical implementation, the computer 1000 may conclude that that darkened pixel corresponds to (and forms a part of) the spatial calibration box 302.

In a typical implementation, the computer 1000 records (e.g., in memory 1004), the traveling distances of the cast rays (e.g., one from each group of cast rays 310 and 311) when the rays hit any darkened pixel (e.g., a pixel having a black color), indicating that the pixel belongs to the calibration box 302. In a typical implementation, the traveling distance is recorded in units of pixels. In an exemplary implementation, the casting process stops when at least one ray from each group of rays 310, 311 hits one black pixel. The coordinates of these two hit points in the unit of pixel are returned (and stored, e.g., in memory 1004). These two coordinates belong to vertex 312 and vertex 313, respectively, of the spatial calibration box 302. Thus, the computer 1000 is able to (and does) determine the height of the spatial calibration box 302 in pixel as being equals the vertical distance between these two vertices. Since the calibration box 302 is a square in a two-dimensional (2D) domain, its location information (e.g., the coordinates of its four vertices) in the image is known by the computer 1000. Thus, the computer 1000 is able to (and does) identify the calibration factor by dividing the physical height of the spatial calibration box (e.g., in millimeters) by its height in pixels. The units of the calibration factor then may be mm/pixel (mm is chosen for representative purpose, other physical units could be chosen) representing the physical dimension in the unit of mm per pixel.

In an alternative embodiment, the pixel height of the calibration box 302 can be obtained by first extracting the pixel information representing the four edges of the box, and then either finding one pair of parallel point sets to calculate the distance between these two point sets or finding the maximum distance among all edge points to get the diagonal distance and then using Pythagorean theorem to calculate the box height. The computer 1000, in such implementations, would perform these calculations. Since the grille 301 and the calibration box 302 are present in the image 307 together, there is some work needed to be done in order to extract the edge information of the calibration box 302. One method is to hide grille 301 and take another screenshot with the box alone without changing the viewing vector and then perform an edge detection (e.g., using ray casting, as described above) to extract calibration box 302's edge information. Another method is to assign a color to the calibration box 302 geometry in the view and use the RGB (red, green, blue) values of that color to identify the calibration box 302. In an implementation, the geometry viewing tool offers an option to assign an appearing color for the geometry. For example, once a box is loaded into a geometry tool, the user can set the color of that box to be yellow or red instead of the default color displayed to the user (usually gray). Say a user sets red for the calibration box. Then the computer 1000 may check the color or RGB values of given image which contains this box and the grille. Since the computer 1000 is able to recognize that the box at issue is red, then the computer 1000 can know that/designate any red pixels as belonging to box. Thus, the computer 1000 in this regard can identify the location of calibration box.

Identification of the Target Image with the Maximum Opening Area

In one embodiment, the computer 1000 stops the rotation-screenshot-taking process after a predefined total number of images has been acquired. This predefined number may be stored in memory (e.g., 1004) and may, in some instances, be user-specified. In such implementations, the process terminates when this number is reached. The computer 1000 typically stores all collected images in memory (e.g., 1004).

As mentioned above, the computer 1000 (at step 208) finds which of the collected image has the maximum (or largest) visible opening size among the images that have been collected. In an exemplary implementation, the collected images are categorized into three groups, the initial image taken at 0° rotation angle, the image set created from backward rotation, and the image set created from forward rotation. In an exemplary implementation, each hole has an area of Ai. The computer 1000 is configured to sum all areas of the holes and get the total opening area A. For each image, the computer 1000 further determines an area A, denoted the maximum opening area, which is equal to the max of all Ai among all images. The image with the maximum opening area displayed is the target image as it represents the largest opening size. To search for this target image, the computer 1000 computes the total opening area of each image starting from the initial image and then sweeps through the backward rotation image set in order of increasing rotation angle, for example. In most instances, the value computed for total opening area changes (e.g., increases or decreases) from image to image as the computer progresses from the initial image through the backward rotation image set. In a typical implementation, the computer 1000 stops the sweeping process if/when the total opening area computed for a particular image is found to be declining (i.e., less than the computed total opening area for the immediately prior image) considered in the sweeping process. This image (i.e., the image in the sequence immediately prior to the image that had the declining total opening area) is selected, and designated in memory 1004, as a temporary target image.

Then, the computer 1000 in this example sweeps the forward rotation image set in order of increasing rotation angle, to determine whether there are any images whose total opening area is larger than the previously designated temporary target image. Similarly, the computer 1000 stops the sweeping process (of forward rotation images) if/when the value is found to be declining from one image to the next image.

If, the sweep of forward rotation images has no images whose total opening area is larger than the previously designated temporary target image (found by scanning the reverse rotation images), then the computer 1000 designates (in memory 1004) the temporary target as a final target image (i.e., the image, among all captured images, that has the largest opening area). If the sweep of forward rotation images reveals any images whose total opening area is larger than the previously designated temporary target image (found by scanning the reverse rotation images), then the computer 1000 designates (in memory 1004) as the final target image that image in the sequence of forward rotation images that came immediately prior to the image that showed a declining total opening area. If the forward and backward sweeps reveal an immediate declining total opening area (relative to the initial image), then the computer 1000 designates (in memory 1004) the initial image as the final target image. Thus, in an exemplary implementation, the final target image is identified by the computer 1000 once this process has been completed.

The process described above may work well for a grille with meshed or honeycomb designs similar to grille 301 or for a grille similar to 401 with horizontal bar designs. When the grille is being rotated, the horizontal bar 402 in the grille 401 (or the hexagonal holes in the grille 301) will create blockage of viewing the holes (e.g., 403) in the grille. Thus, when analyzing the total opening area from image to image, obvious changes are apparent (and able to be identified using the foregoing methods) so the rotating process could be terminated even with the presence of noisy objects such as the logo 404. However, if the grille has a design similar to 406 (with or without a logo) which has bars laid out vertically, the change, if any, in the total opening area will be insignificant when the grille is rotated about a horizontal axis as the vertical bars 406 will not block any holes as the grille is rotated. To help address this challenge, the computer 1000, in some implementations, may introduce an extra step(s) 209 to rotate the grille along its vertical axis 306 if no target image is found in step 208. The image sweeping process in step 208 is repeated for these new sets of images (created by screenshotting an initial view, a series of views of the grille rotated to the left, and a series of views of the grille rotated to the right).

In an alternative embodiment, the computer 1000 stops the rotation-screenshot-taking process by dynamically analyzing the generated image at each angle of 0 and only continuing to generate a new image after the total opening area of current image is computed. This process still follows the sequence of initial-backward-forward screenshot captures. Compared to the method used in the first embodiment described above, this method may end up analyzing fewer or the same number of images depending on the specific grille design involved.

Calculation of the Total Opening Area in an Image

Since the opening size of a single hole is proportional to its area, instead of spending a fair amount of computational resources on calculating the overall opening size of the holes, the computer 1000, in a typical implementation, calculates the total opening area in step 208 in a less computationally intensive manner. To distinguish opening area from the grille frame, the computer creates an image as or converts an image to a binary image that only consists of two colors or distinct appearances (e.g., white and black). Instead of utilizing any image process technique to convert a color or grayscale image to a binary one, the computer 1000, in an exemplary implementation, directly generates a binary image in step 205 when the screenshot is taken by setting the background color of the geometry tool or viewer to be white and the color of grille geometry to be black.

Figure 5B:
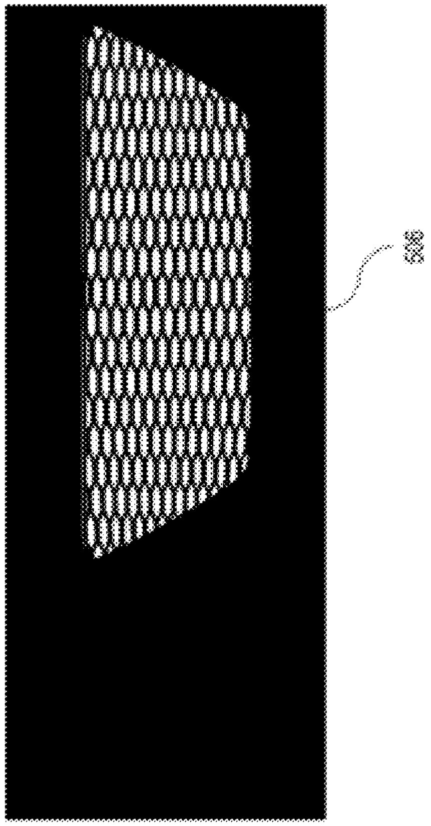
FIGS. 5A and 5B demonstrate a ray casting method used for the preparation of a candidate image for calculating the total opening area in an image.
Figure 5A:
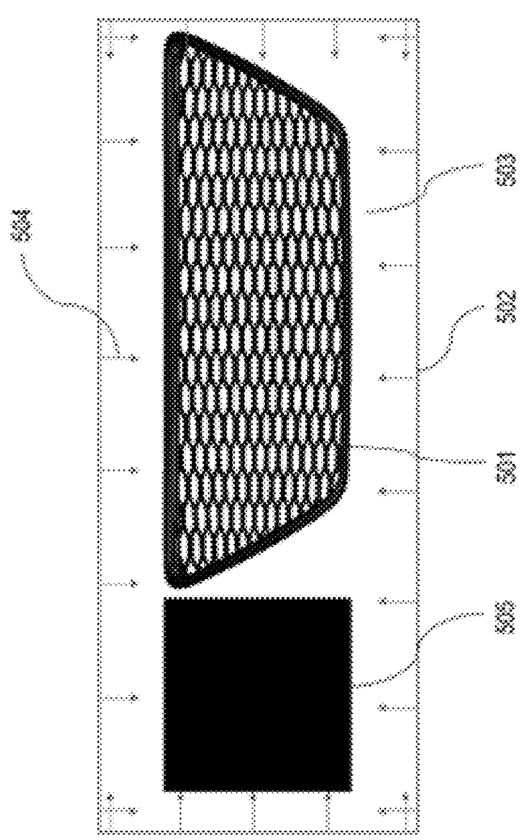

An exemplary appearance of a binary image of a grille 501 (created at step 205), with the background color of the geometry tool or viewer set to be white and the color of grille 501 geometry to be black, is shown as part of the image 502 in FIG. 5A. Also included in image 502 is a view of a spatial calibration box 505 next to the grille 501 geometry.

The image 502 shown in FIG. 5A cannot be directly used for the total opening area calculation by the computer 1000 because the space 503 around the grille 501 and the calibration box 505 has the color of white (like the openings in the grille 501). When being rotated, the change of the total area of the space 503 is unpredictable due to the unknown shape of the input grille 501 (the phrase "input grille" here relates to the grille data loaded into the program or geometry viewer). As a result, errors might be introduced into the target image searching process. To overcome this challenge, the computer 1000 colors the space 503 black to produce the image 506 in FIG. 5B, in which only the holes/openings in the grille 501 are white. The rest of the image 506, as from the white holes/openings, is black.

There are a variety of ways in which the computer 1000 may produce the image 506 in FIG. 5B from the image 502 in FIG. 5A. According to one implementation, the computer 1000 automates the foregoing space coloring process by utilizing a ray casting method and shooting rays 504 (see, e.g., FIG. 5A) from all four sides of the image 502 in a horizontal or vertical inward direction. The computer 1000 examines the color of each pixel that each ray 504 visits and updates the color of that pixel to black if the original color of that pixel was white. Each ray 504 stops when it reaches a pixel that already was black (when the ray reached it). In some instances, reaching the already-black pixel represents the fact that the ray at issue may have reached a boundary of the grille and, therefore, can (and does) stop.

However, the color of the calibration box 505 is also black which would fail the algorithm if not treated specially. For example, if the rays 504 coming off the left side of the image 502 simply stopped when they reached the left edge of the spatial calibration box 505, then portions of the white space 503 between the spatial calibration box 505 and the grille 501 would not get turned black, and subsequent calculations of opening area would be compromised. One way of addressing this challenge is as follows. Since the coordinate information of four vertices of the calibration box 505 has been obtained previously by the computer 1000 (and stored in memory 1004) when the calibration factor was calculated (at 210), the computer 1000 simply does not update the colors for the pixels that the rays reach that are within the spatial calibration box 505 zone (i.e., within the space outlined by a rectangle having corners at the vertices) and resume updating the colors of pixels (from white to black) once a ray reaches pixels that are outside of that zone. Also, even though the pixels are black (inside the spatial calibration box zone), the computer allows the rays to continue moving through the spatial calibration box zone, instead of stopping them, which the computer otherwise does when a ray reaches a black pixel. Once this process is completed, all spaces surrounding the grille 501 and the calibration box 505 will have been colored black as shown in image 506.

Black and white coloring are described herein as being used in a particular manner. In other implementations, the coloring can be reversed from what was just described (and represented in FIGS. 5A and 5B). In still other implementations, different colors, shading, patterns, etc. may be utilized instead of simply black and white coloring.

In an exemplary implementation, the computer 1000 calculates the total number of white pixels in the image 506 of FIG. 5B. The computer 1000 designates this value (total number of white pixels in the image 506) as the total opening area in the image 506. There are a variety of ways in which the computer may accomplish this task (of counting the total number of white pixels). In an exemplary implementation, the computer 1000 utilizes the function findNonZero in the OpenCV® library to compute the total counts of the white pixels in image 506. (See, e.g., Bradski, G., 2000. The OpenCV Library. Dr. Dobb's Journal of Software Tools).

Calculation of Overall Grille Opening Size

Once the final target image is found (at 208), i.e., the image with the maximum opening area, the computer 1000, calculates a calibration factor (or pixel-to-real distance ratio) for this image in step 210. As mentioned above, the computer 1000 calculates the pixel-to-real-distance ratio by Eq. 1 (above, and reproduced again here):

$$R = \frac{L_r}{L_p} \tag{1}$$

where $L_r$ is a real world length of the modelled object (e.g., grille) and $L_p$ is a corresponding length in pixels of the image of the modelled object.

To calculate a value for overall grille opening size (e.g., an average value, excluding any outliers), the information of all openings (e.g., the contour/shape of the gaps/holes) needs to be extracted from the image first. As an initial step towards achieving this goal, according to the flowchart of FIG. 2, the computer 1000 extracts the edges of all objects in the target image (at 211). In an exemplary implementation, the computer 1000 may utilize a Canny edge detector to obtain the edge information. Canny edge detectors may implement computational approaches to edge detection such as described, for example, in Canny, J. *A Computational Approach to Edge Detection*, Institute of Electrical and Electronics Engineers (IEEE) *Transactions on Pattern Analysis and Machine Intelligence,* 8, 679-698 (available on the IEEE website)). An exemplary Canny edge detection algorithm involves these steps: 1) apply a Gaussian filter to smooth the image in order to remove the noise, 2) find the intensity gradients of the image, 3) apply gradient magnitude thresholding or lower bound cut-off suppression to get rid of spurious response to edge detection, 4) apply double threshold to determine potential edges, 5) track edge by hysteresis: finalize the detection of edges by suppressing all the other edges that are weak and not connected to strong edges. In a typical implementation, edge detection produces a binary image where edges from the target image are represented as ones (and may be shown in an image as black pixels) and anything other than an edge is represented as zeros (and may be shown in an image as a white pixel). Variations in the edge detection process are possible. The computer 1000 typically saves the edge information extracted at 210 (in memory 1004) and feeds the extracted edge information into step 212 of the illustrated process.

Next, the computer 1000 (at 212) finds all the contours in the target image, represented by the extracted edge information, and calculates their areas. Contours are essentially curves joining continuous points (along a boundary) having same color or intensity. Contours can be a useful tool for shape analysis and object detection and recognition. In some implementations, the computer 1000 utilizes the findContours function in OpenCV© (see, e.g., Bradski, G., 2000. The OpenCV Library. Dr. Dobb's Journal of Software Tools) to perform contour calculations based on the extracted edge information, for example. This function typically retrieves contours from the binary image form of the target image produced by the edge extraction process discussed above. In an exemplary implementation, the computer 1000 uses an algorithm for finding contours based on the description provided by Satoshi Suzuki, et al. in an article entitled *Topological structural analysis of digitized binary images by border following*, in *Computer Vision, Graphics, and Image Processing,* 30(1):32-46, 1985). The computer 1000 typically saves the contours generated (at 212) in memory 1004.

Figure 6B:
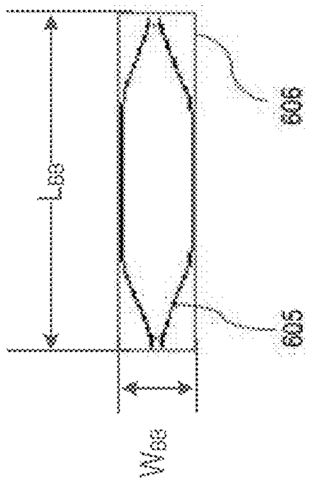
FIGS. 6A and 6B shows contours extracted from a target image with the largest opening area and the orientated bounding box of a single hole used for calculating the opening size of that hole.
Figure 6A:
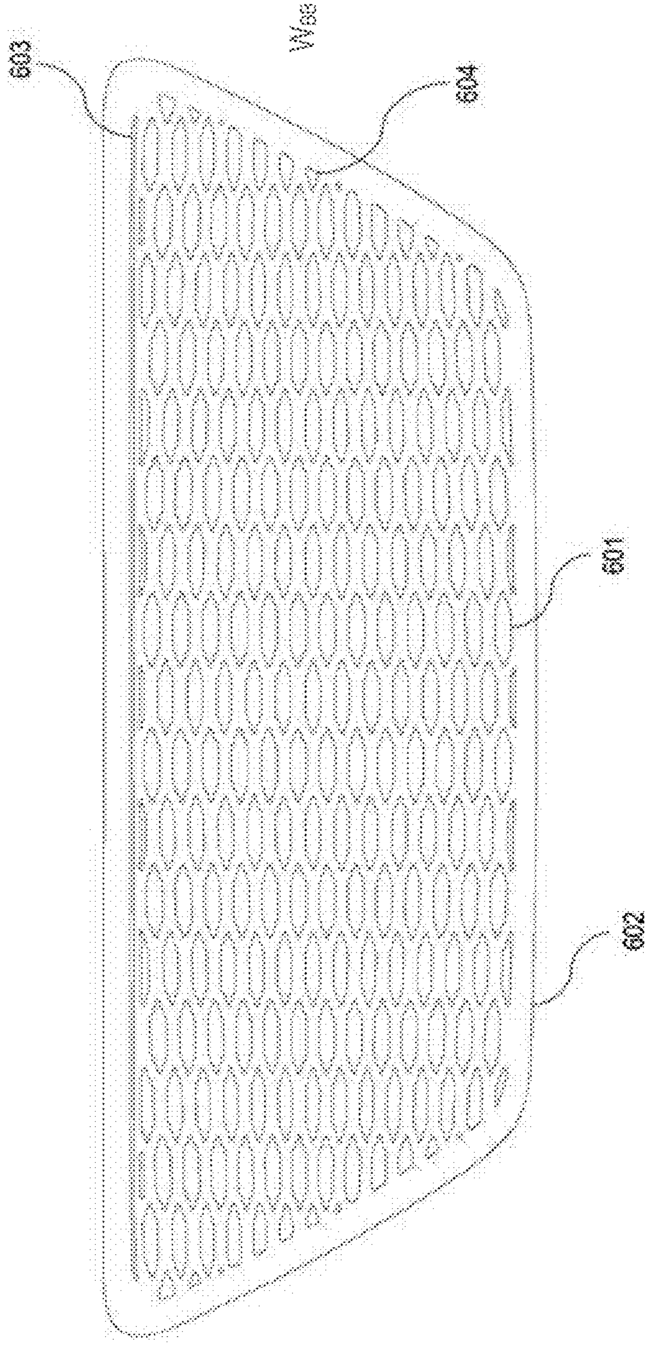

FIG. 6A shows an example of an image produced by finding the contours from a set of extracted edge information of a target image. The image in FIG. 6A shows the grille of the target image with all edges of the grille (e.g., interfaces between solid and space) shown with dark lines and all other space shown in white. Thus, the dark lines in the image provide an outline of all edges from the target image of the grille. In some implementations, the computer 1000 is configured to produce the image shown in FIG. 6A on its display, which may be connected to 1010. These captured contours (as shown in FIG. 6A, for example) are raw and not well suited for use to directly calculate overall grill opening size at least because they include noisy contours such as 602, 603, and 604 in addition to the target contours 601. 602 refers to the boundary of whole grille, so in a typical implementation that may be considered irrelevant and is excluded. For 603 and 604 and/or any other partial holes, the computer in a typical implementation is not going to resolve the flows across them as it tends to be too expensive and unnecessary considering its small percentage to the total number of holes. Basically, the computer drops them and the consequence is insignificant. The target contours 610 in this regard correspond to openings in the grille that are full size—i.e., not truncated by the end of the pattern of openings at the sides, top, or bottom of the grille. Contour 602 is a contour that surrounds all other contours. Contour 603 is a contour that extends across the top of the space within contour 603. Contours 604 correspond to the openings in the grille that are at the sides, top, or bottom of the pattern of openings in the grille and, therefore, are truncated so that they are smaller, sometimes significantly smaller, than the full size (non-truncated) target contours 610 that appear inward of the sides, top, and bottom of the pattern of openings in the grille.

To reject the outliers (e.g., 602, 603, 604), as an initial step, the areas of all raw contours are calculated in step 212. In an exemplary implementation, the areas may be calculated utilizing the function minAreaRect from OpenCV®. This creates a list of area values of all raw contours. In some implementations, this list will identify calculated areas for the space within contours 601, as well as all the space within contours 602, 603, 604, and any other contours that may have been identified by the computer 1000 (at 212).

Next, at 213 in the flowchart of FIG. 2, the computer 1000 rejects outliers (e.g., contours 602, 603, and 604) based on their area values (as calculated in 212) and obtains the list of all candidate contours. In some implementations, the computer 1000 performs this step (of rejecting outliers) according to the following exemplary process.

First, the computer 1000 calculates a deviation value for the calculated area of each element listed in the raw contour area listing using Eq. 2:

$$A_{di} = |A_i - \bar{A}| \quad (2)$$

where $A_i$ is the area of ith contour, $\bar{A}$ is the median value of all areas in the raw contour area list, and $A_{di}$ is the deviation from the median value for ith contour. Thus, the computer 1000 produces (and stores in memory 1004) a listing containing these calculated deviation values $A_{di}$, with one deviation value for each respective one of the area values listed in the raw contour area listing.

Next, the computer 1000 calculates a median value of the deviation values in the listing of calculated deviation values, which may be denoted (and stored in memory 1004) as $\bar{A_d}$.

Next, the computer 1000 normalizes all elements in the deviation list by $\bar{A_d}$ using Eq. 3:

$$A_{ni} = \frac{A_{di}}{\bar{A_d}} \quad (3)$$

where $A_{ni}$ is the normalized area deviation value. $A_{ni}$ is set to be zero when $\bar{A_d}$ is detected to be zero.

Then, the computer 1000 chooses an optimized non-dimensional factor s (an empirical value based on testing) and removes any element of the raw contour area list whose $A_{ni}$ value (or normalized area deviation value) is larger than s. A new contour list only containing certain target openings, like 601, is thus obtained.

Referring again to FIG. 2, next according to the illustrated flowchart, the computer (at 214) calculates a 2D oriented bounding box 606 (see, e.g., FIG. 6B) for each contour or opening 605 represented in the candidate contour list obtained from step 213. In an exemplary implementation, the oriented bounding box 606 may be calculated utilizing the function minAreaRect from OpenCV©. (See, e.g., Bradski, G., 2000. The OpenCV Library. Dr. Dobb's Journal of Software Tools). This function implements the "rotating calipers" algorithm (see, e.g., Shamos, M., 1978. "Computational Geometry," Yale University. pp. 76-81) and applies it on the convex hull of the input points. The phrase "convex hull," in this regard, refers to the smallest convex set that contains a particular shape. In this instance, the input points may be those shown in 605. Given the points defining the shape of 605, this algorithm creates the box 606 from which the computer determines the area.

The box information, for the oriented bounding boxes 606, returned include a width $W_{BB}$ and length $L_{BB}$ for each oriented bounding box 606. The computer 1000 typically stores this information in memory 1004.

The computer 1000 then (at 215) calculates the minimum value between these two for all boxes. This obtained minimum value is the gap size for this opening. By iterating through the whole candidate contour list, a new list of gap sizes is formed. The invention then applies the outlier rejection algorithm utilized in step 213 with this gap size list as the input instead of the area list to further remove additional outliers. In step 216, the invention calculates the average of the final gap size list to obtain the overall opening size of the grille in the unit of pixel. The final physical overall opening size in the unit of mm (or in other physical units) is calculated by multiplying the size in pixel with the calibration factor defined in Eq. 1.

According to one implementation, after the computer gets width (W) and length (L), the gap size is the smaller value between W and L, that is gap size=min(W, L). It is a rectangular box and the computer typically resolves the flow across the hole, meaning using the smaller value between W and L to determine how many mesh cells that are needed to be put there. Previously the computer obtained W and L of all holes/contours, then use gap size=min(W, L) to get the list of gap size for all holes.

In a typical implementation, the computer applies VR 11 and VR10 to cover the grille. VR11 has a meshing size of 1 mm and VR10 has a meshing size of 2 mm. If the returned gap size is 8 mm, for example, then VR11 is needed, because 8 mesh cells are needed across the gap. If the returned gap size is 16 mm, the computer can and typically does remove VR11 to save computational time as VR10 with 2 mm applies which provides 8 cells across this 16 mm gap.

Figure 7A:
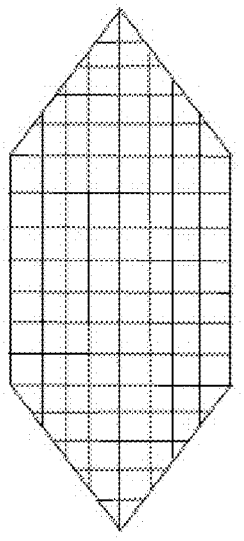
FIGS. 7A-7C show different grille configurations with different meshes applied thereupon.

FIG. 7A is a schematic representation of a grille (represented by the hexagonal outline and a mesh overlay). The illustrated grille is a small one, and the VR region of the associated mesh is VR11 (e.g., the finest VR region) which, as shown, results in 8 rows of cells from the top of the grille to the bottom of the grille.

Figure 7B:
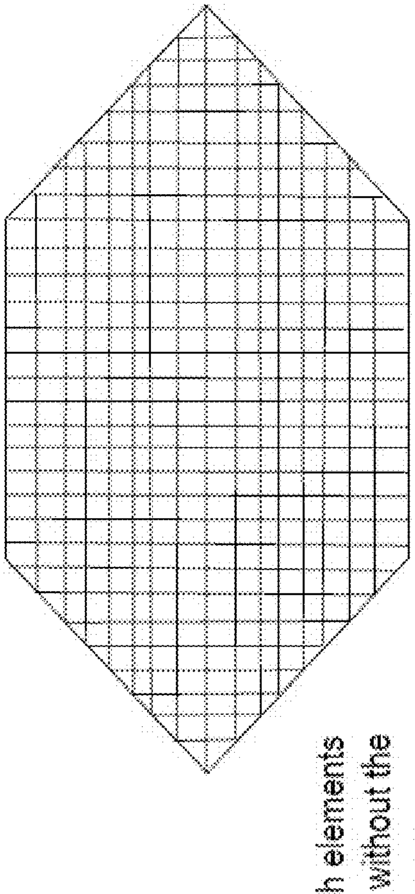

FIG. 7B is a schematic representation of a grille (represented by the hexagonal outline and a mesh overlay). The illustrated grille is a larger one, and the VR region of the associated mesh is VR11 (e.g., the finest VR region) which, as shown, results in 16 rows of cells from the top of the grille to the bottom of the grille. This application of the VR11 mesh results in a waste (i.e., an inefficient use) of computational resources.

Figure 7C:
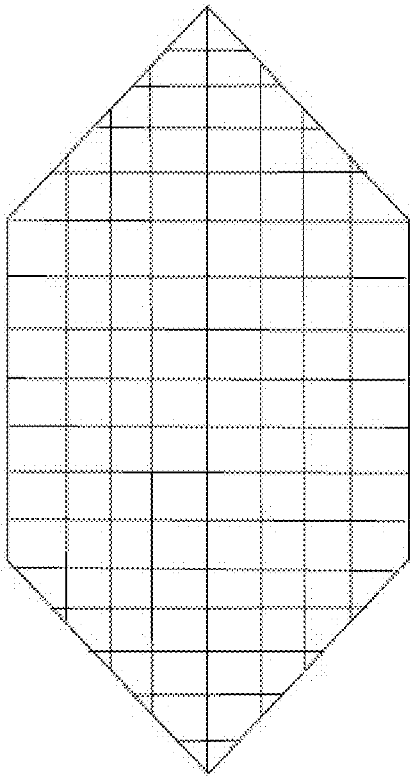

FIG. 7C is a schematic representation of a grille (represented by the hexagonal outline and a mesh overlay). The illustrated grille is a larger one (like the one in FIG. 7B), and the VR region of the associated mesh is VR10 (e.g., the second finest mesh)—automatically selected and applied by the computer 1000 based on the processes set forth herein—which, as shown, results in 8 rows of cells from the top of the grille to the bottom of the grille. This application of the VR10 mesh results in an efficient use of computational resources and high accuracy of any simulations.

Figure 9:
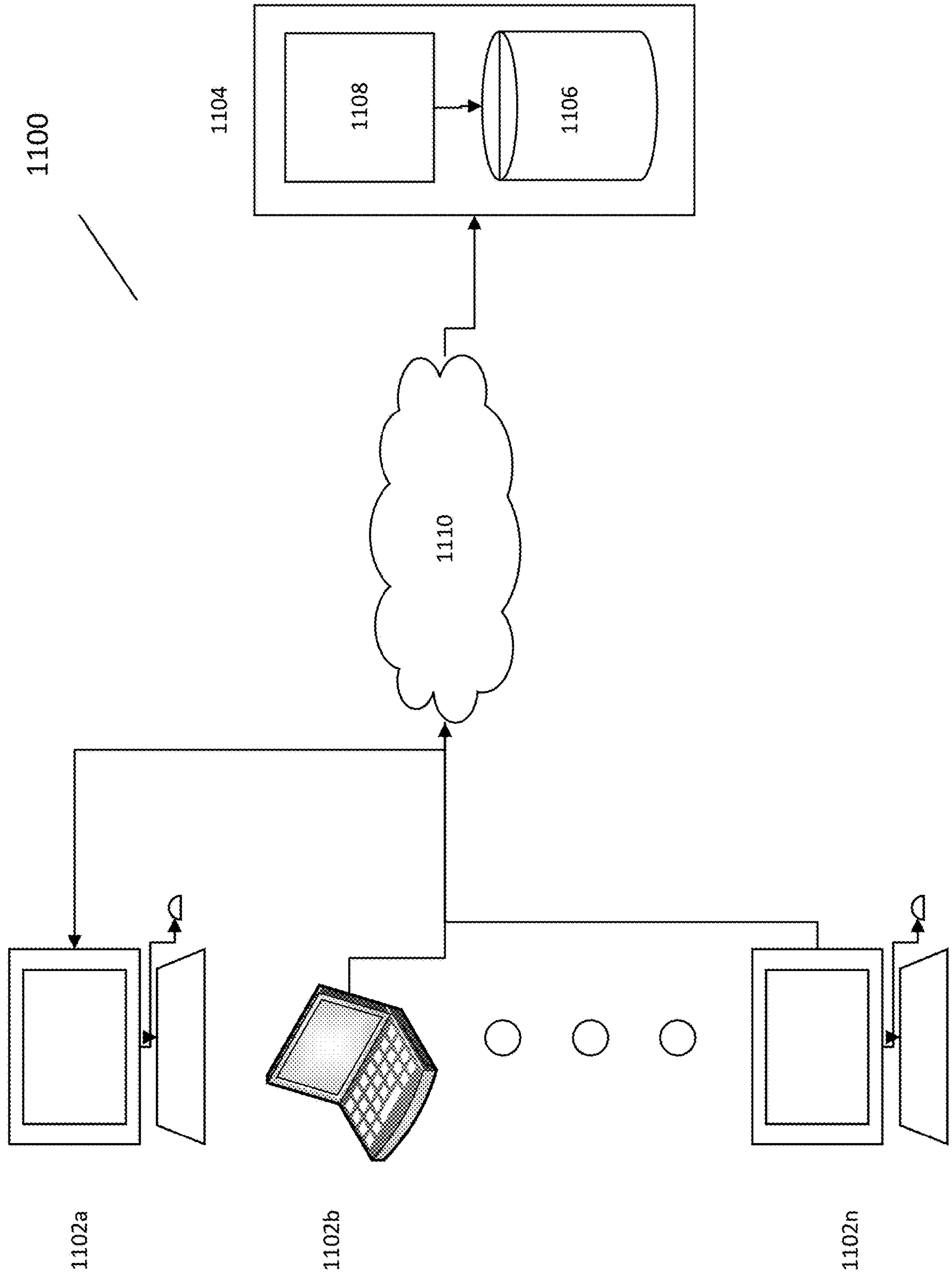
FIG. 9 is a schematic representation of a computer network.

FIG. 9 is a schematic representation of an implementation of a computer system 1100 configured to perform the functionalities disclosed herein.

The illustrated computer system 1100 comprises a plurality of user workstations 1102*a*, 1102*b* . . . 1102*n* and a server 1104 with computer memory 1106 and a computer processor 1108. The workstations 1102*a*, 1102*b* . . . 1102*n* are coupled to the server 1104 and to each other via a communications network 1110 that enables communication therebetween. In a typical implementation, each of the user workstations 1102*a*, 1102*b* . . . 1102*n* may be implemented as a computer (e.g., computer 1000) with computer memory, storage, a computer processor, I/O device interface (with one or more connected I/O devices), and a network interface (connected to the network 1110 to facilitate communications with other network-connected devices). Similarly, the server 1104 may be configured with storage, I/O device interface (with one or more connected I/O devices), and a network interface (connected to the network 1110 to facilitate communications with other network-connected devices).

The computer system 1100 is configured to implement the systems and techniques disclosed herein. In doing so, however, various implementations of the system 1100 may distribute various memory and processing functionalities among multiple different system components across the system. In a typical implementation, human users can access and interact with the system 1100 from any one or more of the user workstations 1102*a*, 1102*b* . . . 1102*n* and processing/memory functions may be performed at those user workstations and/or at processor 1104 with communications therebetween occurring via network 1110.

A number of embodiments of the invention have been described. Nevertheless, it will be understood that various modifications may be made without departing from the spirit and scope of the invention.

For example, the systems and techniques disclosed herein are not limited to grilles on vehicles but could be extended to apply to virtually any kind of grille that facilitates and/or controls air or fluid flow.

Additionally, in some implementations, the systems and techniques disclosed herein can be integrated into automated simulation workflows to automatically create 3D digital geometries to define varied variable resolution (VR) meshing regions for simulating grilles. In some implementations, the systems and techniques can be utilized to quickly create multiple grille models with varied external shape designs in order to perform fast-turnaround simulations at the early design stage.

The ray casting process is not limited to casting rays toward the image of the modeled object (e.g., car) from all directions. In some implementations, rays may be cast toward the modeled object from any two or more directions.

It should be understood that the example embodiments described herein may be implemented in many different ways. In some instances, the various methods and machines described herein may each be implemented by a physical, virtual, or hybrid general purpose computer, such as a computer system, or a computer network environment, such as those described herein. The computer/system may be transformed into the machines that execute the methods described herein, for example, by loading software instructions into either memory or non-volatile storage for execution by the CPU. One of ordinary skill in the art should understand that the computer/system and its various components may be configured to carry out any embodiments or combination of embodiments of the present invention described herein. Further, the system may implement the various embodiments described herein utilizing any combination of hardware, software, and firmware modules operatively coupled, internally, or externally, to or incorporated into the computer/system.

Various aspects of the subject matter disclosed herein can be implemented in digital electronic circuitry, or in computer-based software, firmware, or hardware, including the structures disclosed in this specification and/or their structural equivalents, and/or in combinations thereof. In some embodiments, the subject matter disclosed herein can be implemented in one or more computer programs, that is, one or more modules of computer program instructions, encoded on computer storage medium for execution by, or to control the operation of, one or more data processing apparatuses (e.g., processors). Alternatively, or additionally, the program instructions can be encoded on an artificially generated propagated signal, for example, a machine-generated electrical, optical, or electromagnetic signal that is generated to encode information for transmission to suitable receiver apparatus for execution by a data processing apparatus. A computer storage medium can be, or can be included within, a computer-readable storage device, a computer-readable storage substrate, a random or serial access memory array or device, or a combination thereof. While a computer storage medium should not be considered to be solely a propagated signal, a computer storage medium may be a source or destination of computer program instructions encoded in an artificially generated propagated signal. The computer storage medium can also be, or be included in, one or more separate physical components or media, for example, multiple CDs, computer disks, and/or other storage devices.

Certain operations described in this specification can be implemented as operations performed by a data processing apparatus (e.g., a processor/specially programmed processor/computer) on data stored on one or more computer-readable storage devices or received from other sources, such as the computer system and/or network environment described herein. The term "processor" (or the like) encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing, and grid computing infrastructures.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described herein as occurring in a particular order or manner, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Each functional component mentioned herein may be implemented, for example, by one of more computer hardware components (e.g., one or more computer processors) executing specially programmed computer readable instructions stored on computer-readable media (e.g., hardware memory in the form of RAM, ROM, etc.) to perform the associated computer-implemented functionalities described herein.

The systems and techniques disclosed herein may be utilized in connection with the overall design, analysis, and real-world manufacturing of an object (e.g., a grille). Typically, the simulation processes disclosed herein may be utilized to analyze the performance or behavior of the modeled object (e.g., grille) to confirm expectations or to guide further iterations in the design of the modeled object, and/or associated systems (that will include the grille). Typically, the design and analysis/simulation will be followed by manufacturing a real-world version of the modeled object (e.g., grille) based on a final design that has been exposed to computer-based simulations, prior to manufacturing, utilizing the systems and techniques disclosed herein. The final manufactured real world version of the modeled object would be a physical thing (e.g., a grille or the like).

Other implementations are within the scope of the claims.

What is claimed is:

1. A computer-implemented method comprising automatically determining a ventilation grille opening size estimation for numerical simulation setup automation based on an input in a computer-implemented environment, the computer-implemented method comprising:

creating screenshots of a plurality of computer-rendered images of a three-dimensional grille geometry, with the three-dimensional grille geometry disposed at a different angle of rotation about a first axis;

identifying which, if any, of the screenshots has an image of the three-dimensional grille geometry with a total opening value that is larger than every other one of the screenshot three-dimensional grille geometry images; and designating the identified image as a target image for further processing to determine the ventilation grille opening size estimation.

2. The computer-implemented method of claim 1, wherein the total opening value represents a size of the openings in the three-dimensional grille geometry as they appear in the corresponding screenshot with the three-dimensional grille geometry disposed at the corresponding angle of rotation.

3. The computer-implemented method of claim 2, wherein the total opening value is, for at least some or all of the screenshots, different.

4. The computer-implemented method of claim 1, wherein identifying which, if any, of the screenshot three-dimensional grille geometry images has the largest total opening value comprises:

for each respective one of the screenshots:

calculating an area value that represents the area of the openings in the grille geometry as they appear in the corresponding screenshot disposed at the corresponding angle of rotation about the first axis; and designating the screenshot with the largest calculated area value as the screenshot three-dimensional grille geometry image with the largest total opening value.

5. The computer-implemented method of claim 1, wherein creating the screenshots of the plurality of computer-rendered images of the three-dimensional grille geometry comprises:

identifying an initial viewing vector to define a perspective from which the screenshots are created.

6. The computer-implemented method of claim 1, wherein creating the screenshots of the plurality of computer-rendered images of the three-dimensional grille geometry further comprises:

creating a first screenshot of the computer-rendered image of the three-dimensional grille geometry with the image of the three-dimensional grille geometry disposed at a first angle of rotation about the first axis;

rotating the computer-rendered image of the three-dimensional grille geometry about the first axis to two or more subsequent angles of rotation about the first axis; and creating subsequent screenshots of the computer-rendered image of the three-dimensional grille geometry disposed at each respective one of the two or more subsequent angles of rotation about the first axis.

7. The computer-implemented method of claim 6, wherein rotating the computer-rendered image of the three-dimensional grille geometry about the first axis occurs in a first direction until and unless the total opening value for the images gets smaller in sequential screenshots with increasing angles of rotation; and in response to the total opening value for the images getting smaller in sequential screenshots with increasing angles of rotation:

rotating the computer-rendered image of the three-dimensional grille geometry about the first axis in a second direction, opposite the first direction; and creating a subsequent screenshot of the computer-rendered image of the three-dimensional grille geometry with the image of the three-dimensional grille geometry disposed at a subsequent angle after having been rotated in the second direction.

8. The computer-implemented method of claim 1, further comprising if none of the screenshots is identified as having the largest total opening value, then creating screenshots of computer-rendered images of the three-dimensional grille geometry at a different angles of rotation about a second axis that is different than the first axis.

9. The computer-implemented method of claim 1, further comprising:

calculating a calibration factor for the target image, wherein the calibration factor represents a pixel-to-real distance ratio;

extracting edges of the target image;

identifying contours in the target image based on the extracted edges; and calculating areas within the identified contours.

10. The computer-implemented method of claim 9, further comprising:

rejecting outlier contours based on the area calculations to produce a contour list containing only preserved contours;

calculating a two-dimensional oriented bounding box for each contour represented in the contour list and returning a width value and a length value for each respective one of the two-dimensional oriented bounding boxes;

identifying a minimum value, as between the width value and the length value, for each respective one of the two-dimensional oriented bounding boxes; and calculating a final opening size value to represent the ventilation grille opening size estimation based on the identified minimum values.

11. The computer-implemented method of claim 1, further comprising:

importing the three-dimensional grille geometry from a source application; and calculating an oriented bounding box based on the three-dimensional grille geometry.

12. The computer-implemented method of claim 1, further comprising:

creating a spatial calibration box to associate a pixel domain of a computer-rendered image of the three-dimensional grille geometry and a physical domain for including a real-world version of a grille based on the three-dimensional grille geometry.

13. The computer-implemented method of claim 1, further comprising:

automatically assigning a particular one of two or more variable resolution region options to the grille geometry as part of a setup of the numerical simulation in a computer-implemented environment based on the calculated final opening size.

14. The computer-implemented method of claim 13, further comprising:

performing the numerical simulation on the three-dimensional grille geometry based on the automatically assigned variable resolution region.

15. The computer-implemented method of claim 14, further comprising manufacturing a plurality of real world grilles with real world machines based on the three-dimensional grille geometry after performing the numerical simulation.

16. A computer-implemented method comprising automatically determining a ventilation grille opening size estimation for numerical simulation setup automation based on an input in a computer-implemented environment, the computer-implemented method comprising:

importing a three-dimensional grille geometry;

calculating an oriented bounding box based on the three-dimensional grille geometry;

identifying an initial viewing vector for the imported three-dimensional grille geometry;

creating a spatial calibration box to associate a pixel domain of a computer-rendered image of the three-dimensional grille geometry and a physical domain for including a real-world version of a grille based on the three-dimensional grille geometry;

screenshotting a series of computer-rendered images of the three-dimensional grille geometry from a perspective defined by the initial viewing vector and with the three-dimensional grille geometry disposed at different orientations, each orientation showing the image of the three-dimensional grille geometry at a different angle of rotation about a first axis;

identifying which, if any, of the screenshot three-dimensional grille geometry images has a total opening value that is larger than every other one of the screenshot three-dimensional grille geometry images;

designating the image in the screenshot three-dimensional grille geometry image identified as having a total opening value that is larger than every other one of the screenshot three-dimensional grille geometry images as a target image;

calculating a calibration factor for the target image;

extracting edges of the target image;

identifying contours in the target image;

calculating areas within the identified contours;

rejecting outlier contours based on the area calculations to produce a contour list containing only preserved contours;

calculating a two-dimensional oriented bounding box for each contour represented in the contour list and returning a width value and a length value for each respective one of the two-dimensional oriented bounding boxes;

identifying a minimum value, as between the width value and the length value, for each respective one of the two-dimensional oriented bounding boxes; and calculating a final opening size value to represent the ventilation grille opening size estimation based on the identified minimum values.

17. The computer-implemented method of claim 16, further comprising:

automatically assigning a particular one of two or more variable resolution options to a region associated with the grille geometry as part of a setup of a numerical simulation in a computer-implemented environment based on the calculated final opening size; and performing the numerical simulation on the three-dimensional grille geometry based on the automatically assigned variable resolution region.

18. The computer-implemented method of claim 17, further comprising manufacturing a plurality of real world grilles with real world machines based on the three-dimensional grille geometry after performing the numerical simulation.

19. A computer system configured to automatically determine a ventilation grille opening size estimation for numerical simulation setup automation based on an input in a computer-implemented environment, the computer system comprising:

a computer processor; and computer-based memory operatively coupled to the computer processor, wherein the computer-based memory stores computer-readable instructions that, when executed by the computer processor, cause the computer-based system to:

create screenshots of a plurality of computer-rendered images of a three-dimensional grille geometry, with the three-dimensional grille geometry disposed at a different angle of rotation about a first axis;

identify which, if any, of the screenshots has an image of the three-dimensional grille geometry with a total opening value that is larger than every other one of the screenshot three-dimensional grille geometry images; and designate the identified image as a target image for further processing to determine the ventilation grille opening size estimation.

20. A non-transitory computer readable medium having stored thereon computer-readable instructions that, when executed by a computer-based processor, cause the computer-based processor to automatically determine a ventilation grille opening size estimation for numerical simulation setup automation based on an input in a computer-implemented environment, by utilizing a process comprising:

creating screenshots of a plurality of computer-rendered images of a three-dimensional grille geometry, with the three-dimensional grille geometry disposed at a different angle of rotation about a first axis;

identifying which, if any, of the screenshots has an image of the three-dimensional grille geometry with a total opening value that is larger than every other one of the screenshot three-dimensional grille geometry images; and designating the identified image as a target image for further processing to determine the ventilation grille opening size estimation.

* * * * *